(12) United States Patent
Wu et al.

(10) Patent No.: US 12,211,877 B2
(45) Date of Patent: Jan. 28, 2025

(54) BACK-SIDE DEEP TRENCH ISOLATION STRUCTURE FOR IMAGE SENSOR

(71) Applicant: Taiwan Semiconductor Manufacturing Company, Ltd., Hsin-Chu (TW)

(72) Inventors: Cheng-Ta Wu, Shueishang Township (TW); Kuo-Hwa Tzeng, Taipei (TW); Yeur-Luen Tu, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/364,682

(22) Filed: Aug. 3, 2023

(65) Prior Publication Data

US 2023/0387170 A1    Nov. 30, 2023

Related U.S. Application Data

(62) Division of application No. 17/036,202, filed on Sep. 29, 2020, now Pat. No. 11,955,496.

(51) Int. Cl.
    *H01L 27/146*    (2006.01)
(52) U.S. Cl.
    CPC .... *H01L 27/1463* (2013.01); *H01L 27/14636* (2013.01); *H01L 27/1464* (2013.01); *H01L 27/14643* (2013.01); *H01L 27/14689* (2013.01)
(58) Field of Classification Search
    None
    See application file for complete search history.

(56) References Cited

U.S. PATENT DOCUMENTS

| 2013/0320420 | A1 | 12/2013 | Kao et al. |
| 2015/0243694 | A1 | 8/2015 | Ihara |
| 2015/0279894 | A1 | 10/2015 | Cheng et al. |
| 2018/0301502 | A1 | 10/2018 | Lee et al. |
| 2019/0096929 | A1* | 3/2019 | Chiang ............ H01L 27/14612 |

(Continued)

OTHER PUBLICATIONS

Non-Final Office Action dated Aug. 10, 2023 for U.S. Appl. No. 17/036,202.

(Continued)

*Primary Examiner* — Michelle Mandala
*Assistant Examiner* — Jordan M Klein
(74) *Attorney, Agent, or Firm* — Eschweiler & Potashnik, LLC

(57) ABSTRACT

The present disclosure relates to an image sensor having a photodiode surrounded by a back-side deep trench isolation (BDTI) structure, and an associated method of formation. In some embodiments, a plurality of pixel regions is disposed within an image sensing die and respectively comprises a photodiode configured to convert radiation into an electrical signal. The photodiode comprises a photodiode doping column with a first doping type surrounded by a photodiode doping layer with a second doping type that is different than the first doping type. A BDTI structure is disposed between adjacent pixel regions and extending from the back-side of the image sensor die to a position within the photodiode doping layer. The BDTI structure comprises a doped liner with the second doping type and a dielectric fill layer. The doped liner lines a sidewall surface of the dielectric fill layer.

20 Claims, 19 Drawing Sheets

(56) References Cited

U.S. PATENT DOCUMENTS

| | | |
|---|---|---|
| 2019/0148430 A1 | 5/2019 | Chu et al. |
| 2019/0165009 A1 | 5/2019 | Wu et al. |
| 2020/0098798 A1 | 3/2020 | Takahashi et al. |
| 2020/0111821 A1 | 4/2020 | Hong et al. |

OTHER PUBLICATIONS

Notice of Allowance dated Dec. 19, 2023 for U.S. Appl. No. 17/036,202.

* cited by examiner

BACK-SIDE DEEP TRENCH ISOLATION STRUCTURE FOR IMAGE SENSOR

REFERENCE TO RELATED APPLICATION

This application is a Divisional of U.S. application Ser. No. 17/036,202, filed on Sep. 29, 2020, the contents of which are hereby incorporated by reference in their entirety.

BACKGROUND

Many modern day electronic devices comprise optical imaging devices (e.g., digital cameras) that use image sensors. An image sensor may include an array of pixel sensors and supporting logic. The pixel sensors measure incident radiation (e.g., light) and convert to digital data, and the supporting logic facilitates readout of the measurements. One type of image sensor is a backside illuminated (BSI) image sensor device. BSI image sensor devices are used for sensing a volume of light projected towards a back-side of a substrate (which is opposite to a front-side of the substrate where interconnect structures including multiple metal and dielectric layers are built thereon). BSI image sensor devices provide a reduced destructive interference, as compared to front-side illuminated (FSI) image sensor device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
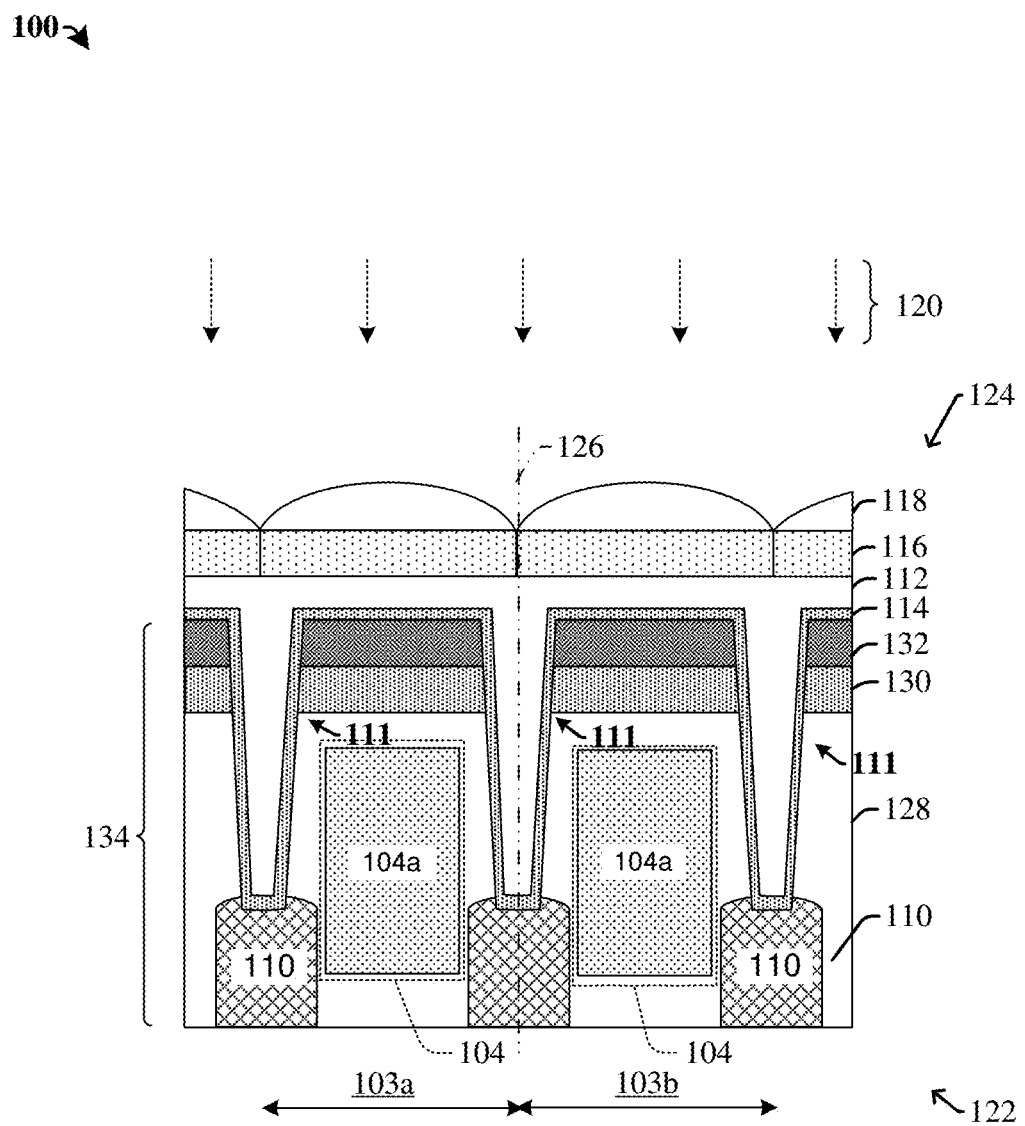
FIG. 1 illustrates a cross-sectional view of some embodiments of a CMOS (complementary metal-oxide-semiconductor) image sensor having a photodiode surrounded by a back-side deep trench isolation (BDTI) structure with a doped liner.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Integrated circuit (IC) technologies are constantly being improved. Such improvements frequently involve scaling down device geometries to achieve lower fabrication costs, higher device integration density, higher speeds, and better performance. Due to device scaling, pixel sensors of an image sensor have smaller dimensions and are closer to one another. An improved electrical and optical isolation between neighboring pixels of the image sensor is needed in order to reduce blooming and crosstalk. Dielectric trenches and implantation wells can be fabricated as isolation structures to isolate image sensor pixels. One kind of image sensor fabrication processes includes an implantation process to form deep implant wells through the depth of the photodiode as isolation walls. However, besides fabrication complexity, these implantation processes involve a thick photoresist layer which reduces exposure resolution. For example, if the critical dimension is smaller than 0.2 µm, a precise lithography process is hardly achievable with a photoresist layer greater than 3 µm. Also, in order to form the deep implant well through the depth of the photodiode, a width of the deep implant well increases as the implantation process continues, thus, a photodiode area is reduced due to the existence of the deep implant well. A reduced photodiode area results in a reduced amount of charge the photodiode can hold, and therefore a full well capacity of the photodiode is reduced and limited by the implant profile, which negatively affect performance of the image sensor.

In view of the above, the present disclosure relates to an image sensor comprising a back-side deep trench isolation (BDTI) structure with a doped liner, and an associated method of formation. In some embodiments, the image sensor has a plurality of pixel regions disposed within an image sensing die. The pixel regions respectively have a photodiode configured to convert radiation into an electric signal. The photodiode includes a photodiode doping column with a first doping type surrounded by a substrate with a second doping type that is different than the first doping type. A BDTI structure is disposed between adjacent pixel regions and extending from a back-side of the image sensing die to a position within the photodiode doping layer. The BDTI structure comprises a doped liner with the second doping type and a dielectric fill layer. The doped liner lines a sidewall surface of the deep trench, and the dielectric fill layer fills an inner space of the deep trench. With the BDTI structure functioned as the deep depletion and isolation structure between neighboring pixels, no deep implantation is needed. Thereby, the implantation processes from a front-side of the substrate does not need to extend as deep as before to function as an isolation and depletion structure and therefore can be performed for a shorter time and simplified. Further, the width of doped region on the front-side of the substrate is narrower since the time for performing the implantation processes is shorter than before. Thus, a lateral area of the individual photodiodes can be expanded with narrower boundaries therebetween and more pixels can be arranged in a certain chip area, which results in an improved exposure resolution. Also, as discussed above, an effective photodiode area can be expanded as the BDTI structure with the doped liner can be narrower than the deep implantation well, and the full well capacity of the photodiode is improved.

The doped liner can be formed by varies techniques. In some embodiments, the doped liner is formed by an enhanced plasma doping process with a protection layer lining bottom and sidewall surfaces of a deep trench between adjacent pixel regions first. The protection layer helps to avoid damages from the direct implant and achieve a more uniform thickness, a smoother surface, and a less surface concentration of the doped liner. Thereby, the surface of the doped liner has less defects and dark current of the image sensor device can be significantly improved. The protection layer is then removed, and a low temperature anneal is performed for dopant activation after the plasma doping process. As an example for non-limiting purposes, the annealing temperature can be in a range of from 250° C. to approximately 500° C. In some alternative embodiments, the doped liner is formed by a low temperature epitaxial process followed by a laser or microwave annealing process for dopant activation. More details of the formation method of the doped liner are discussed associated with FIGS. 13-15.

FIG. 1 illustrates a cross-sectional view 100 of some embodiments of an image sensor having a photodiode surrounded by a BDTI structure with a conformal photodiode doping layer. The image sensing die 134 has a front-side 122 and a back-side 124. The image sensing die 134 comprises a plurality of pixel regions that may be arranged in an array comprising rows and/or columns, such as pixel regions 103a, 103b shown in FIG. 1. The pixel regions 103a, 103b respectively comprises a photodiode 104 configured to convert incident radiation or incident light 120 (e.g., photons) into an electric signal. In some embodiments, the photodiode 104 comprises a first region such as a photodiode doping column 104a having a first doping type (e.g., p-type doping by dopants such as boron, aluminum, indium, etc.) and an adjoining second region such as a photodiode doping layer 128 having a second doping type (e.g., n-type doping by dopants such as phosphorus, arsenic, antimony, etc.) that is different than the first doping type.

A BDTI structure 111 is disposed between and isolate adjacent pixel regions 103a, 103b. The BDTI structure 111 may extends from the back-side 124 of the image sensing die 134 to a position within the photodiode doping layer 128. In some embodiments, the BDTI structure 111 comprises a doped liner 114 with the first doping type (e.g., p-type doping) and a dielectric fill layer 112. The doped liner 114 lines a sidewall surface of a deep trench of the photodiode doping layer 128, and the dielectric fill layer 112 fills a remaining space of the deep trench. The doped liner 114 may comprise or be made of boron or other p-type dopants doped silicon or other semiconductor material. The dielectric fill layer 112 may be made of silicon dioxide, silicon nitride, and/or other applicable dielectric material. In some embodiments, the BDTI structure 111 may have a depth range between approximately 1.5 μm and approximately 5 μm. A lateral dimension of the BDTI structure 111 may have a range between approximately 0.1 μm and approximately 0.3 μm. The lateral dimensions of the BDTI structure 111 should be sufficient to perform the formation of the doped liner 114 and other layers inside the BDTI structure (for example, as described associated with FIGS. 13-16 below). In some embodiments, a dopant concentration of the doped liner 114 may be in a range between approximately 5E17 atoms/cm$^3$ to approximately 1E19 atoms/cm$^3$. A thickness of the doped liner 114 may be in a range between approximately 4 nm and approximately 20 nm. The conformity of the doped liner 114 from top to bottom is greater than 90%. A surface concentration of the doped liner 114 is smaller than 1E19/cm$^2$. The surface roughness of the doped liner 114 is also improved. In some embodiments, the more uniform thickness, the smoother surface, and the less surface concentration of the doped liner 114 is a result of an enhanced plasma doping process with a protection layer. More details of the formation method of the doped liner are discussed associated with FIGS. 13-15.

Figure 2:
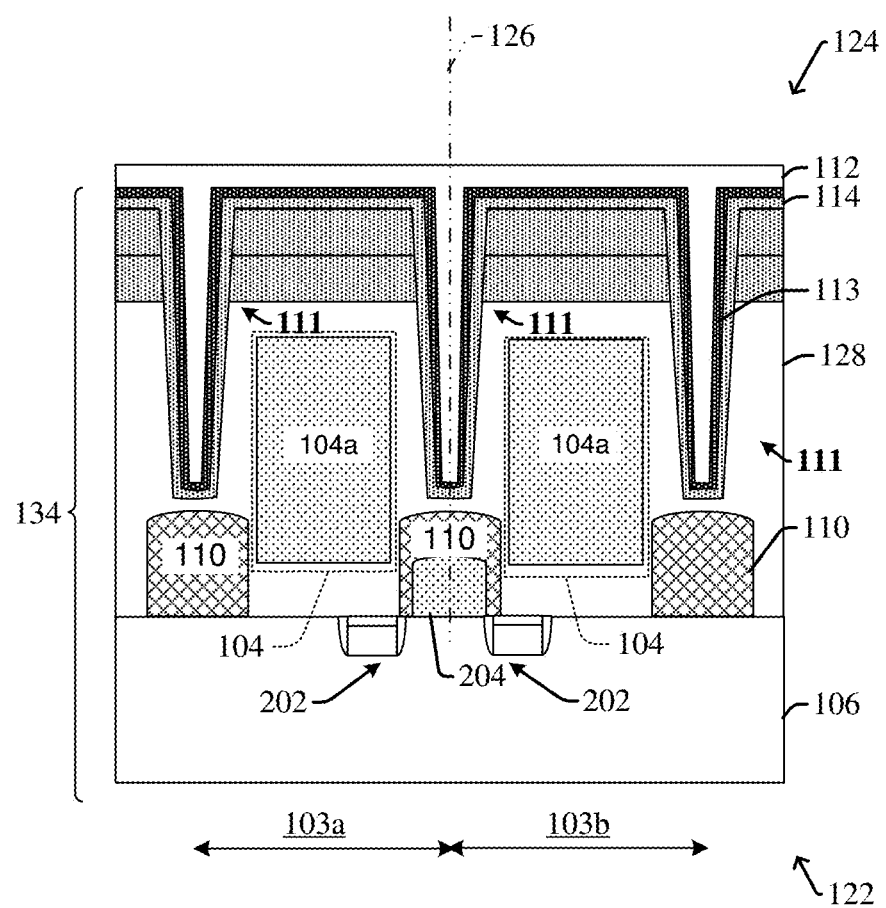
FIG. 2 illustrates a cross-sectional view of some other embodiments of an image sensor comprising a photodiode surrounded by a BDTI structure with a doped liner.

In some embodiments, a doped isolation well 110 is also disposed between and isolate adjacent pixel regions 103a, 103b, extending from the front-side 122 of the image sensing die 134 to a position within the photodiode doping layer 128. The doped isolation well 110 may have the first doping type (e.g., p-type doping). The doped isolation well 110 may be vertically aligned with the BDTI structure 111 (e.g. sharing a common center line 126). In some embodiments, a bottom portion of the BDTI structure 111 may be disposed within a recessed top surface of the doped isolation well 110, as shown in FIG. 1. In this case, the doped isolation well 110 may reach less than a half or even less than ¼ depth of the BDTI structure 111. In some alternative embodiments, the doped isolation well 110 may be separated from the BDTI structure 111 by the photodiode doping layer 128, as shown by FIG. 2 below. By forming a doped isolation well 110 that is shallower, the width of the isolation well 110 is narrower since the time for performing the implantation processes for the isolation well is shorter than before. Thus, a lateral area of the individual photodiodes can be expanded with narrower boundaries therebetween and more pixels can be arranged in a certain chip area, which results in an improved exposure resolution. Also, photodiode area can be expanded, and the full well capacity of the photodiode is improved. More related explanations of the shallow doped isolation well can be found associated with FIGS. 5A-5B below. The BDTI structure 111 and the doped isolation well 110 collectively function as isolations for the pixel regions 103a, 103b, such that crosstalk and blooming among the pixel regions 103a, 103b can be reduced. The BDTI structure 111 and the doped isolation well 110 also collectively facilitate depletion of the photodiode 104 during the operation since the BDTI structure 111 and the doped isolation well 110 provide additional P-type dopants to the photodiode 104, such that full well capacity is improved.

In some embodiments, a plurality of color filters 116 are arranged over the back-side 124 of the image sensing die 134. The plurality of color filters 116 are respectively configured to transmit specific wavelengths of incident radiation or incident light 120. For example, a first color filter (e.g., a red color filter) may transmit light having wavelengths within a first range, while a second color filter may transmit light having wavelengths within a second range different than the first range. In some embodiments, the plurality of color filters 116 may be arranged within a grid structure overlying the photodiode 104. In some embodiments, the grid structure may comprise a stacked grid having a metal framework surrounded by a dielectric material. In some embodiments, layer of dielectric material and the stacked grid may have a same dielectric material (e.g., silicon-dioxide ($SiO_2$)).

A plurality of micro-lenses 118 are arranged over the plurality of color filters 116. Respective micro-lenses 118 are aligned laterally with the color filters 116 and overlie the pixel regions 103a, 103b. In some embodiments, the plurality of micro-lenses 118 have a substantially flat bottom surface abutting the plurality of color filters 116 and a curved upper surface. The curved upper surface is configured to focus the incident radiation or incident light 120 (e.g., light towards the underlying pixel regions 103a, 103b. During operation of the image sensor, the incident radiation or incident light 120 is focused by the micro-lenses 118 to the underlying pixel regions 103a, 103b. When incident radiation or incident light of sufficient energy strikes the photodiodes 104, it generates an electron-hole pair that produces a photocurrent. Notably, though the micro-lenses 118 is shown as fixing onto the image sensor in FIG. 1, it is appreciated that the image sensor may not include microlens, and the micro-lens may be attached to the image sensor later in a separate manufacture activity.

FIG. 2 illustrates a cross-sectional view 200 of some additional embodiments of an image sensor comprising the photodiode 104 surrounded by the BDTI structure 111 with the doped liner 114. As mentioned above, in some embodiments, the doped isolation well 110 may be separated from the BDTI structure 111 by the photodiode doping layer 128. In some embodiments, the BDTI structure 111 further comprises a high-k dielectric liner 113 disposed between the doped liner 114 and the dielectric fill layer 112 and separating the doped liner 114 from dielectric fill layer 112. The high-k dielectric liner 113 may be conformal layers. The high-k dielectric liner 113 may comprise aluminum oxide ($Al_2O_3$), hafnium oxide ($HfO_2$), hafnium silicon oxide (HfSiO), hafnium aluminum oxide (HfAlO), tantalum oxide ($Ta_2O_5$), or hafnium tantalum oxide (HMO), for example. Other applicable high-k dielectric materials are also within the scope of the disclosure. In some embodiments, the high-k dielectric liner 113 may have a thickness range between approximately 30 nm and approximately 100 nm and may be made of composite of multiple high-k dielectric materials. The doped liner 114, the high-k dielectric liner 113 and the dielectric fill layer 112 may laterally extend along the back-side 124 of the image sensing die 134. The image sensor shown in FIG. 2 may be an intermediate structure, and the doped liner 114, the high-k dielectric liner 113 and the dielectric fill layer 112 may or may not subject to a planarization process such that top surfaces of the layers could be altered.

In some embodiments, a floating diffusion well 204 is disposed between the adjacent pixel regions 103a, 103b from the front-side 122 of the image sensing die 134 to a position within the photodiode doping layer 128. A transfer gate 202 is arranged over the photodiode doping layer 128 at a position laterally between the photodiode 104 and the floating diffusion well 204. During the operation, the transfer gate 202 controls charge transfer from the photodiode 104 to the floating diffusion well 204. If the charge level is sufficiently high within the floating diffusion well 204, a source follower transistor (not shown) is activated and charges are selectively output according to operation of a row select transistor (not shown) used for addressing. A reset transistor (not shown) can be used to reset the photodiode 104 between exposure periods.

Figure 3:
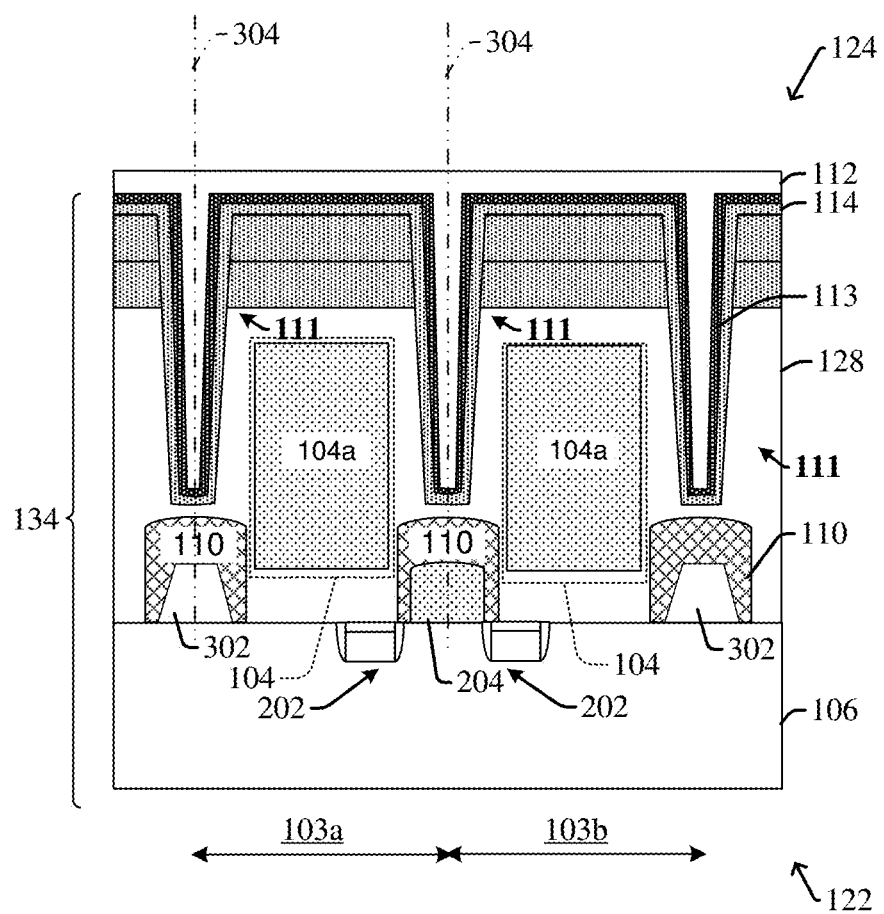
FIG. 3 illustrates a cross-sectional view of some other embodiments of an image sensor comprising a photodiode surrounded by a BDTI structure with a doped liner.

FIG. 3 illustrates a cross-sectional view 300 of some additional embodiments of an image sensor comprising a photodiode 104 surrounded by a BDTI structure 111 with a doped liner 114. Besides similar features shown and described above for FIG. 1 and FIG. 2, in some embodiments, as shown in FIG. 3, a shallow trench isolation (STI) structure 302 is disposed between the adjacent pixel regions 103a, 103b from the front-side 122 of the image sensing die 134 to a position within the photodiode doping layer 128. The STI structure 302 and the BDTI structure 111 may be vertically aligned (e.g. sharing a common center line 304, which may or may not share a center line with the doped isolation well 110). In some embodiments, the doped isolation well 110 extends from the front-side 122 of the image sensing die 134 to a position within the photodiode doping layer 128 and surrounding the STI structure 302. The doped isolation well 110 may separate the STI structure 302 from the photodiode doping layer 128 and/or the BDTI structure 111. It is understood that features shown in FIG. 1 and FIG. 2 and described above can be incorporated in the embodiments associated with FIG. 3. For example, though FIG. 3 shows the doped isolation well 110 being separated from the BDTI structure 111 by the photodiode doping layer, the doped isolation well 110 may reach an upper portion of the BDTI structure 111 similar as shown in FIG. 1. In that case, the STI structure 302 may contact or be separated from the BDTI structure 111. The BDTI structure 111, the doped isolation well 110, and the STI structure 302 collectively function as isolations for the pixel regions 103a, 103b, such that crosstalk and blooming among the pixel regions 103a, 103b can be reduced. The doped liner 114 of the BDTI structure 111 and the doped isolation well 110 also collectively facilitate depletion of the photodiode 104 during the operation, such that full well capacity is improved.

Figure 4:
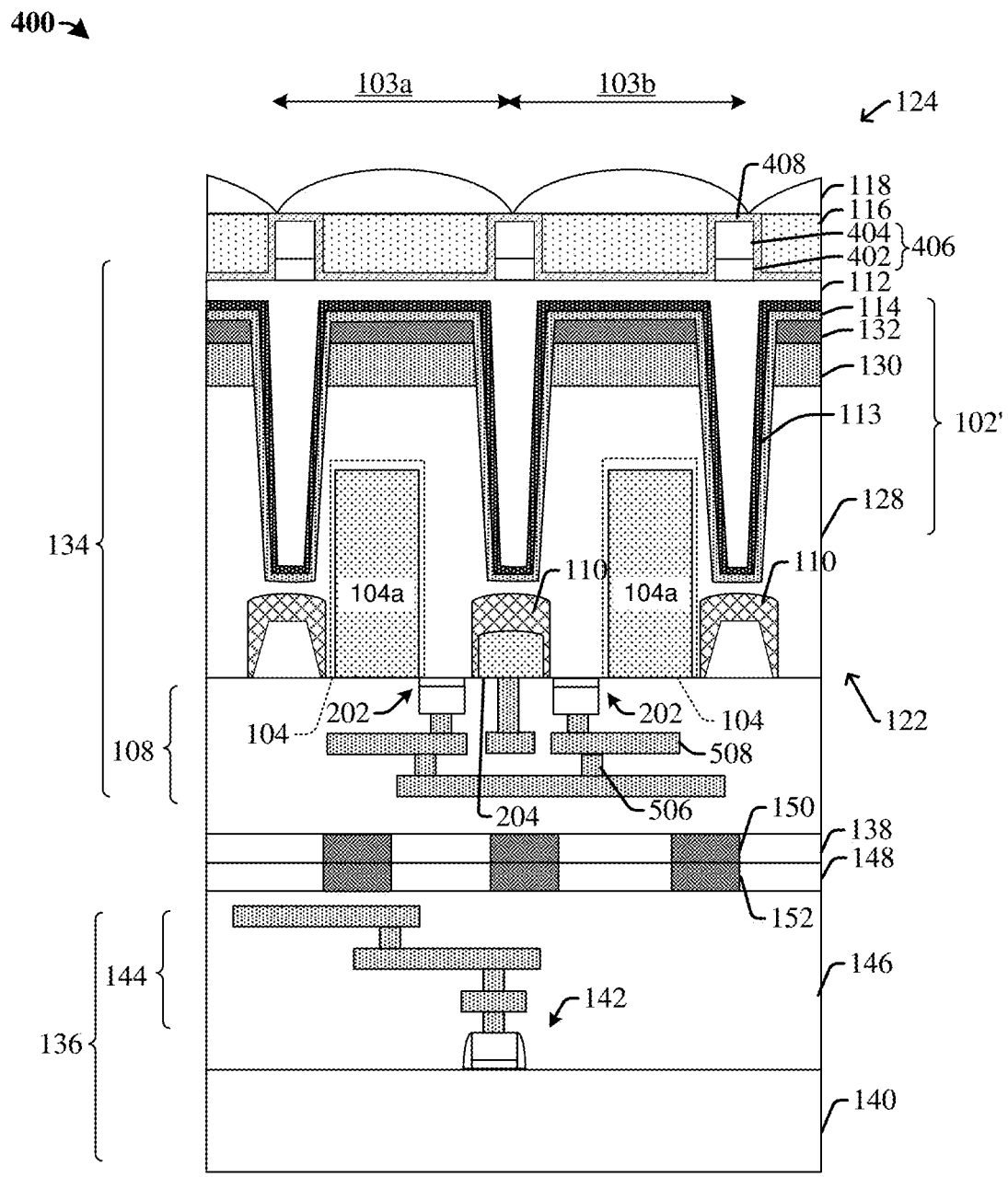
FIG. 4 illustrates a cross-sectional view of some embodiments of an integrated chip comprising an image sensing die and a logic die bonded together where the image sensing die has a photodiode surrounded by a BDTI structure with a doped liner.

FIG. 4 illustrates a cross-sectional view 400 of some embodiments of an integrated chip comprising an image sensing die 134 and a logic die 136 bonded together where the image sensing die 134 has a photodiode 104 surrounded by a BDTI structure 111 with a doped liner 114. In some embodiments, the image sensing die 134 may have structures shown and described associated with FIGS. 1-3 above. The image sensing die 134 may further comprise a composite grid 406 overlying the substrate 102' between adjacent pixel regions 103a, 103b. The composite grid 406 may comprise a metal layer 402 and a dielectric layer 404 one stacked another at the back-side 124 of the image sensing die 134. A dielectric liner 408 lines sidewall and top of the composite grid 406. The metal layer 402 may be or be comprised of one or more layers of tungsten, copper, aluminum copper, or titanium nitride. The metal layer 402 may have a thickness range between approximately 100 nm and approximately 500 nm. The dielectric layer 404 may be or be comprised of one or more layers of silicon dioxide, silicon nitride, or the combination thereof. The dielectric layer 404 may have a thickness range between approximately 200 nm and approximately 800 nm. The dielectric liner 408 may be or be comprised of an oxide, such as silicon dioxide. The dielectric liner 408 may have a thickness range between approximately 5 nm and approximately 50 nm. Other applicable metal materials are also within the scope of the disclosure. A metallization stack 108 may be arranged on the front-side 122 of the image sensing die 134. The metallization stack 108 comprises a plurality of metal interconnect layers arranged within one or more inter-level dielectric (ILD) layers 106. The ILD layers 106 may comprise one or more of a low-k dielectric layer (i.e., a dielectric with a dielectric constant less than about 3.9), an ultra low-k dielectric layer, or an oxide (e.g., silicon oxide).

The logic die 136 may comprise logic devices 142 disposed over a substrate 140. The logic die 136 may further comprises a metallization stack 144 disposed within an ILD layer 146 overlying the logic devices 142. The image sensing die 134 and the logic die 136 may be bonded face to face, face to back, or back to back. As an example for non-limiting purpose, FIG. 4 shows a face to face bonding structure where a pair of intermediate bonding dielectric layers 138, 148, and bonding pads 150, 152 are arranged between the image sensing die 134 and the logic die 136 and respectively bond the metallization stacks 108, 144. In some embodiments, the bonding process may comprise a fusion or a eutectic bonding process.

Figure 5A:
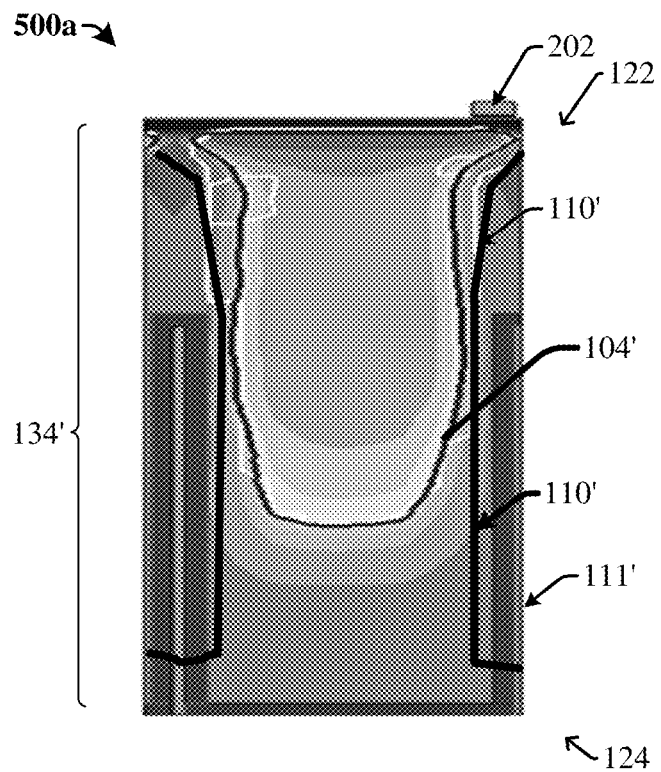
FIG. 5A illustrates a schematic diagram of an image sensor comprising a photodiode isolated by a deep isolation well and a BDTI structure without a doped liner.

FIG. 5A illustrates a schematic simulation diagrams 500a of an image sensing die 134' comprising a photodiode 104' isolated by a BDTI structure 111' and a deep isolation well 110'. The BDTI structure 111' extends from a back-side 124 of the image sensing die 134', and the deep isolation well 110' extends from a front-side 122 of the image sensing die 134'. The BDTI structure 111' may be absent of a doped liner. The deep isolation well 110' vertically extends to a deep low position and reaches to the BDTI structure 111'. The deep isolation well 110' may cross a half or even more than ¾ depth of the BDTI structure 111'. The photodiode 104' extends from the front-side 122 and can be read by the transfer gate 202 as described associated with FIG. 2. The deep isolation well 110' may be formed by implantation and provide isolation for the photodiode 104'. However, the formation of the deep isolation well 110' is difficult due to its depth requirement. The implantation process involves a thick photoresist layer which reduces exposure resolution. Also, a photodiode area of the photodiode 104' is reduced due to the existence of the deep isolation well 110', and a full well capacity of the deep isolation well 110' is limited by the implant profile, which negatively affect performance of the image sensing die 134'.

Figure 5B:
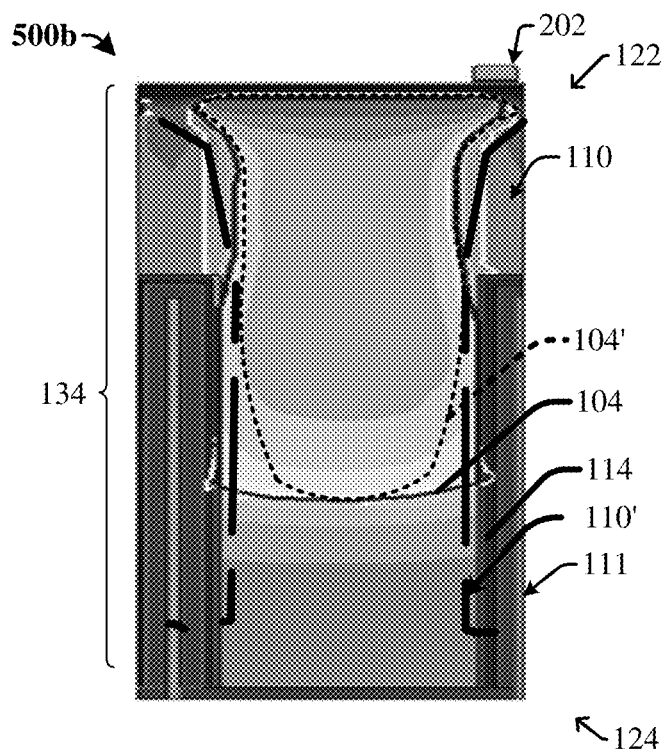
FIG. 5B illustrates a schematic diagram of some embodiments of an image sensor comprising a photodiode isolated by a shallow isolation well and a BDTI structure with a doped liner.

FIG. 5B illustrates a schematic simulation diagrams 500b of an improved image sensing die 134 comprising a photodiode 104 isolated by a BDTI structure 111 with a doped liner 114 extending from a back-side 124 and a doped isolation well 110 extending from a front-side 122. The doped isolation well 110 may be shallowly implanted. In some embodiments, the doped isolation well 110 is vertically separated from the BDTI structure 111 similar as shown in FIG. 2. In some alternative embodiments, the doped isolation well 110 reaches an upper portion of the BDTI structure 111, similar as shown in FIG. 1. In this case, the doped isolation well 110 may reach less than a half or even less than ¼ depth of the BDTI structure 111. By forming a doped isolation well 110 that is shallower, the exposure resolution is improved and the implantation processes is simplified. Also, photodiode area can be expanded, and the full well capacity of the photodiode is improved. For comparison purpose, the deep isolation well 110' and the resulting narrower photodiode 104' of FIG. 5A are reproduced on FIG. 5B. A photodiode area of the photodiode 104 is approximately between 5% to 15% greater than a photodiode area of the photodiode 104' of the image sensing die 134' of FIG. 5A. A full well capacity of the photodiode 104 is approximately 10% greater than a full well capacity of the photodiode 104' of the image sensing die 134' of FIG. 5A.

FIGS. 6-20 illustrate some embodiments of cross-sectional views 600-2000 showing a method of forming an image sensor having a photodiode surrounded by a BDTI structure with a doped liner. Though doping types are provided for varies doped regions as an example, it is appreciated that reversed doping types can be used for these doped regions to realize a reversed image sensor device structure.

Figure 6:
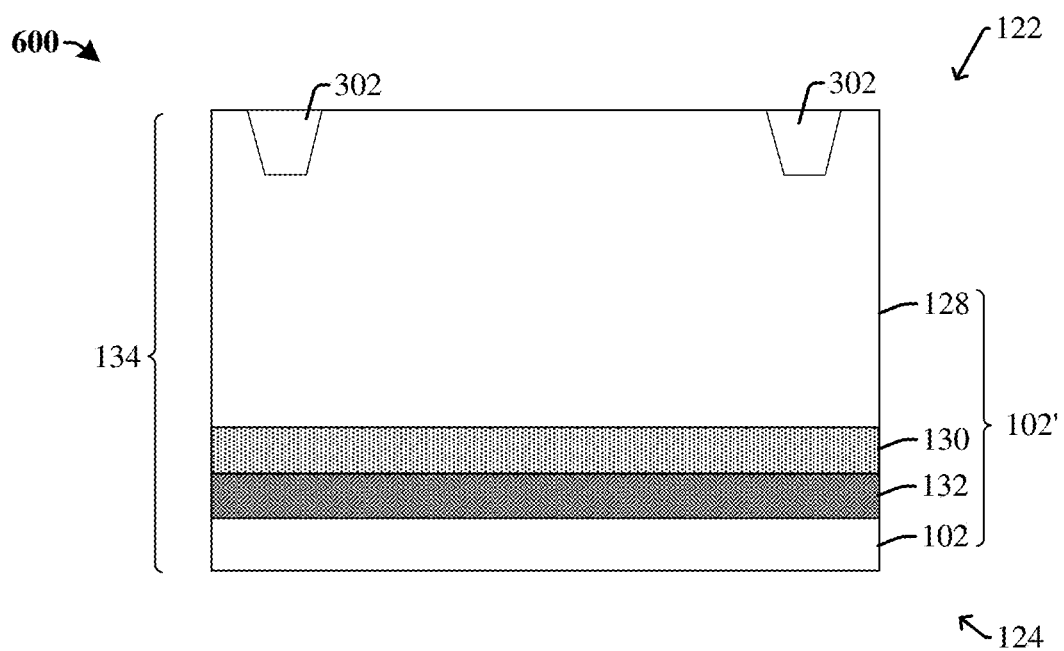
FIGS. 6-20 illustrate some embodiments of cross-sectional views showing a method of forming an image sensor having a photodiode surrounded by a BDTI structure having a conformal doped layer.

As shown in cross-sectional view 600 of FIG. 6, a substrate 102' is provided for an image sensing die 134. In various embodiments, the substrate 102' may comprise any type of semiconductor body (e.g., silicon/germanium/CMOS bulk, SiGe, SOI, etc.) such as a semiconductor wafer or one or more die on a wafer, as well as any other type of semiconductor and/or epitaxial layers formed thereon and/or otherwise associated therewith. For example, a pixel array deep p-type well 132 may be formed on a handling substrate 102. The handling substrate 102 can be or be comprised of a highly doped p-type substrate layer. A pixel array deep n-type well 130 may be formed on the pixel array deep p-type well 132. The pixel array deep n-type well 130 and the pixel array deep p-type well 132 may be formed by implantation processes. In some embodiments, a photodiode doping layer 128 is formed as an upper portion of the substrate 102'. The photodiode doping layer 128 may be formed by a p-type epitaxial process. In some embodiments, a plurality of shallow trench isolation (STI) structures 302 is formed at a boundary and/or between adjacent pixel regions 103a, 103b from a front-side 122 of the image sensing die 134 to a position within the photodiode doping layer 128. The one or more STI structures 302 may be formed by selectively etching the front-side 122 of the image sensing die 134 to form shallow-trenches and subsequently forming an oxide within the shallow-trenches.

Figure 7:
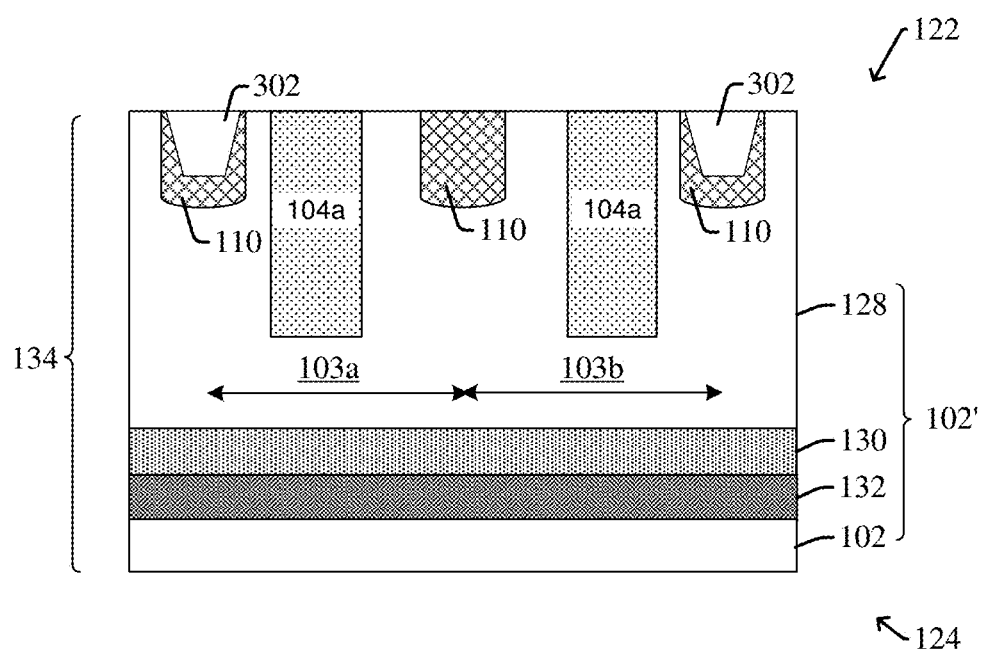

As shown in cross-sectional view 700 of FIG. 7, dopant species are implanted into the photodiode doping layer 128 to form doped region. A plurality of photodiode doping columns 104a is formed by implanting n-type dopant species respectively within the pixel regions 103a, 103b. A plurality of doped isolation wells 110 may be formed by implanting p-type dopant species into the photodiode doping layer 128 between adjacent pixel regions 103a, 103b. The plurality of doped isolation wells 110 may be formed from the front-side 122 of the image sensing die 134 to a position deeper than the STI structures 302. The doped isolation wells 110 may respectively be centrally aligned with the STI structures 302. In some embodiments, the photodiode doping layer 128 may be selectively implanted according to a patterned masking layer (not shown) comprising photoresist.

Figure 8:
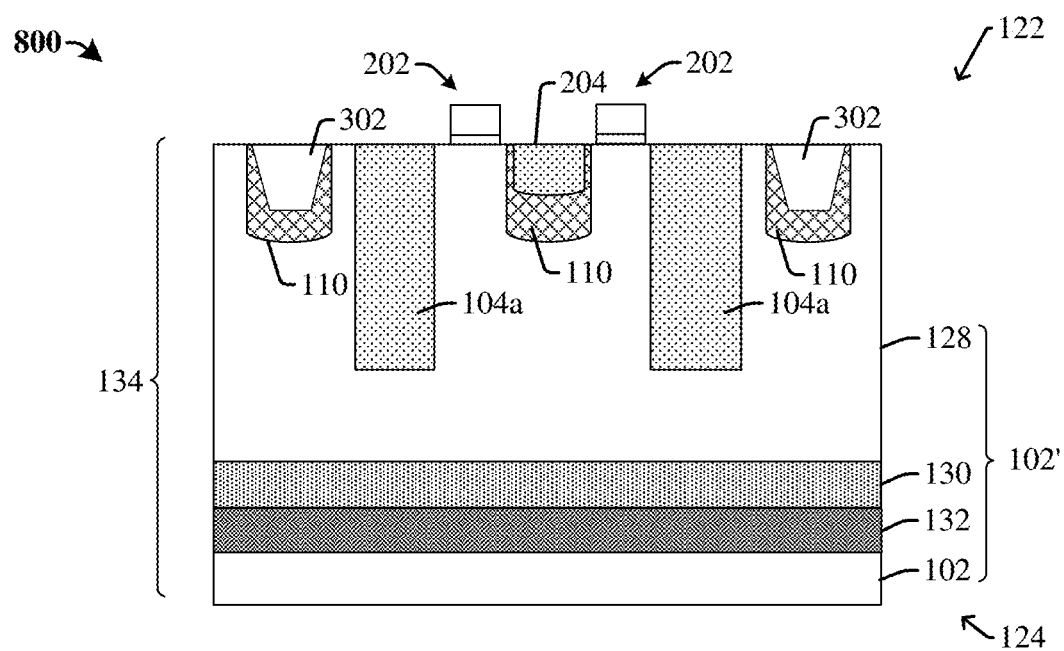

As shown in cross-sectional view 800 of FIG. 8, a transfer gate 202 is formed over a front-side 122 of the image sensing die 134. The transfer gate 202 may be formed by depositing a gate dielectric film and a gate electrode film over the substrate 102'. The gate dielectric film and the gate electrode film are subsequently patterned to form a gate dielectric layer and a gate electrode. Sidewall spacers may be formed on the outer sidewalls of the gate electrode. In some embodiments, the sidewall spacers may be formed by depositing nitride onto the front-side 122 of the image sensing die 134 and selectively etching the nitride to form the sidewall spacers. Implantation processes are performed within the front-side 122 of the image sensing die 134 to form a floating diffusion well 204 along one side of the transfer gate 202 or opposing sides of a pair of the transfer gates 202 as shown in FIG. 7.

Figure 9:
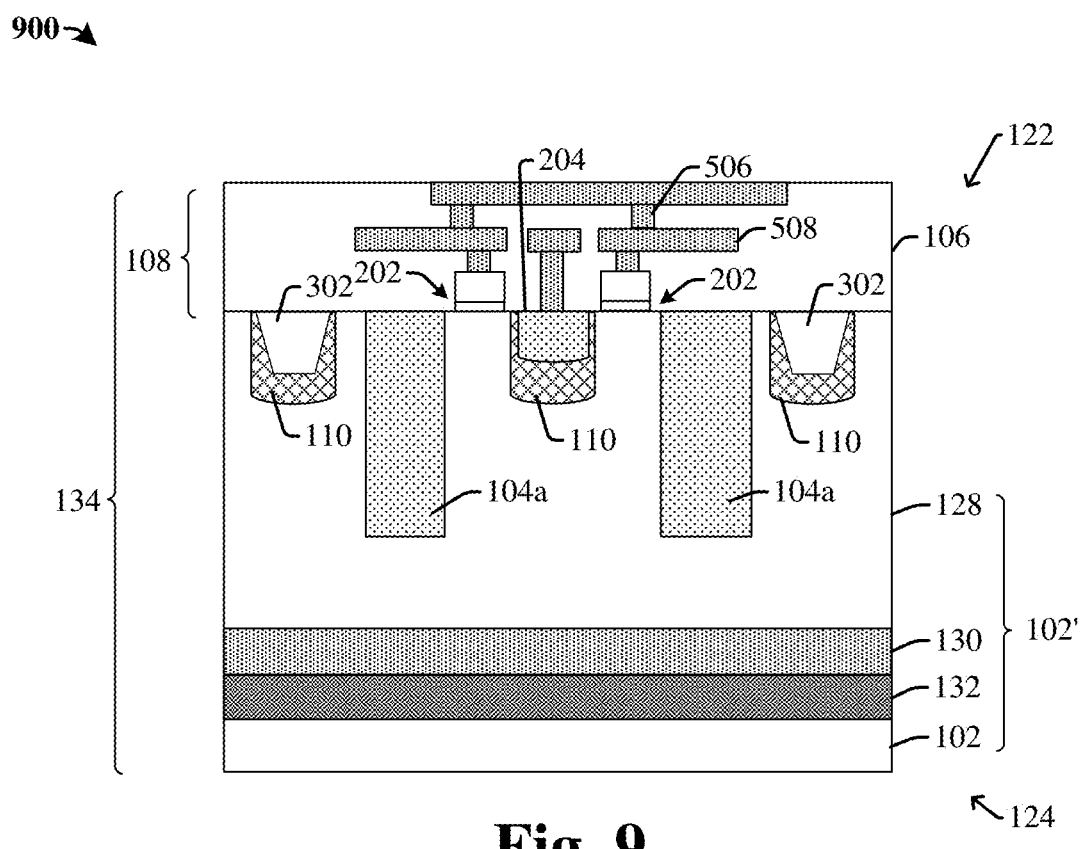

As shown in cross-sectional view 900 of FIG. 9, a metallization stack 108 may be formed from the front-side 122 of the image sensing die 134. In some embodiments, the metallization stack 108 may be formed by forming an ILD layer 106, which comprises one or more layers of ILD material, over the front-side 122 of the image sensing die 134. The ILD layer 106 is subsequently etched to form via holes and/or metal trenches. The via holes and/or metal trenches are then filled with a conductive material to form the plurality of metal interconnect vias 506 and metal lines 508. In some embodiments, the ILD layer 106 may be deposited by a physical vapor deposition technique (e.g., PVD, CVD, etc.). The plurality of metal interconnect layers may be formed using a deposition process and/or a plating process (e.g., electroplating, electro-less plating, etc.). In various embodiments, the plurality of metal interconnect layers may comprise tungsten, copper, or aluminum copper, for example.

Figure 10:
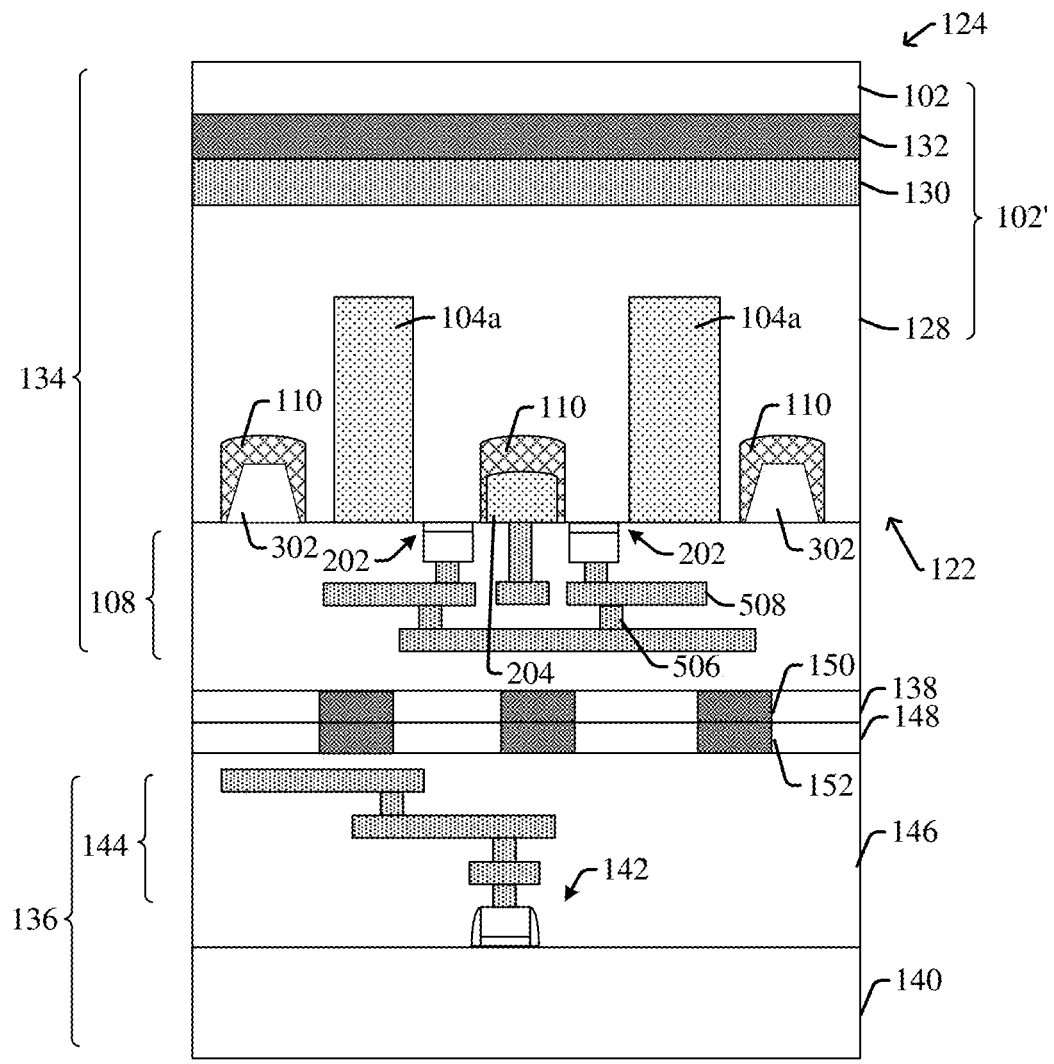

As shown in cross-sectional view 1000 of FIG. 10, the image sensing die 134 can be then bonded to one or more other dies. For example, the image sensing die 134 can be bonded to a logic die 136 prepared to have logic devices 142. The image sensing die 134 and the logic die 136 may be bonded face to face, face to back, or back to back. For example, the bonding process may use a pair of intermediate bonding dielectric layers 138, 148, and bonding pads 150, 152 to bond the metallization stacks 108, 144 of the image sensing die 134 and the logic die 136. The bonding process may comprise a fusion or a eutectic bonding process. The bonding process may also comprise a hybrid bonding process including metal to metal bonding of the bonding pads 150, 152, and dielectric to dielectric bonding of the intermediate bonding dielectric layers 138, 148. An annealing process may follow the hybrid bonding process, and may be performed at a temperature range between about 250° C. to about 450° for a time in a range of about 0.5 hour to about 4 hours, for example.

Figure 11:
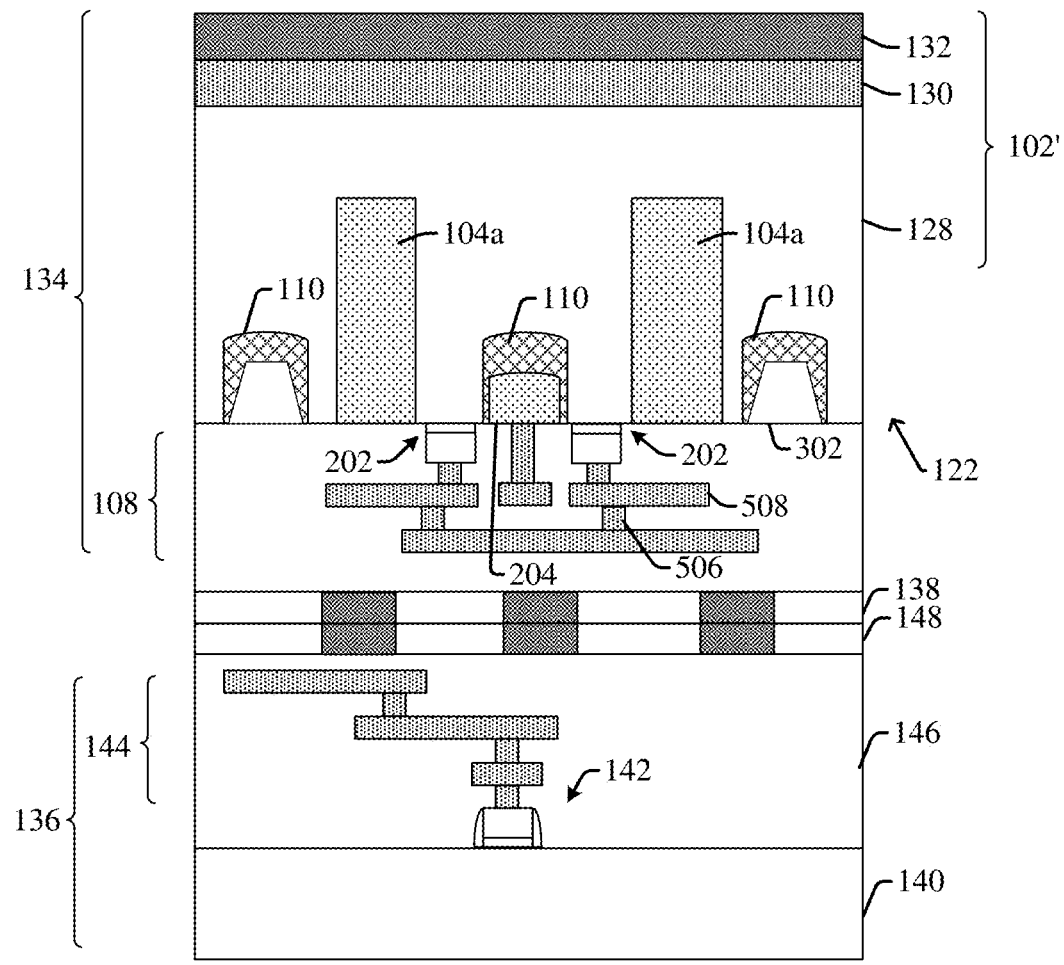

As shown in cross-sectional view 1100 of FIG. 11, the image sensing die 134 is thinned on a back-side 124 that is opposite to the front-side 122. The thinning process may partially or completely removes the handling substrate 102 (See FIG. 10) and allow for radiation to pass through the back-side 124 of the image sensing die 134 to the photodiode 104. The substrate 102' may be thinned by etching the back-side 124 of the image sensing die 134. Alternatively, the substrate 102' may be thinned by mechanical grinding the back-side 124 of the image sensing die 134. As an example for non-limiting purpose, the substrate 102' can be firstly grinded to a thickness range between approximately 17 µm and approximately 45 µm. Then, an aggressive wet etch can be applied to further thin the substrate 102'. An example of the etchant may include HF/nitric/acetic acid (HNA). A chemical mechanical process and a tetramethylammonium hydroxide (TMAH)) wet etching may then follow to further thin a thickness range between approximately 2.8 µm and approximately 7.2 µm so the radiation can pass through the back-side 124 of the image sensing die 134 to reach the photodiode 104.

Figure 12:
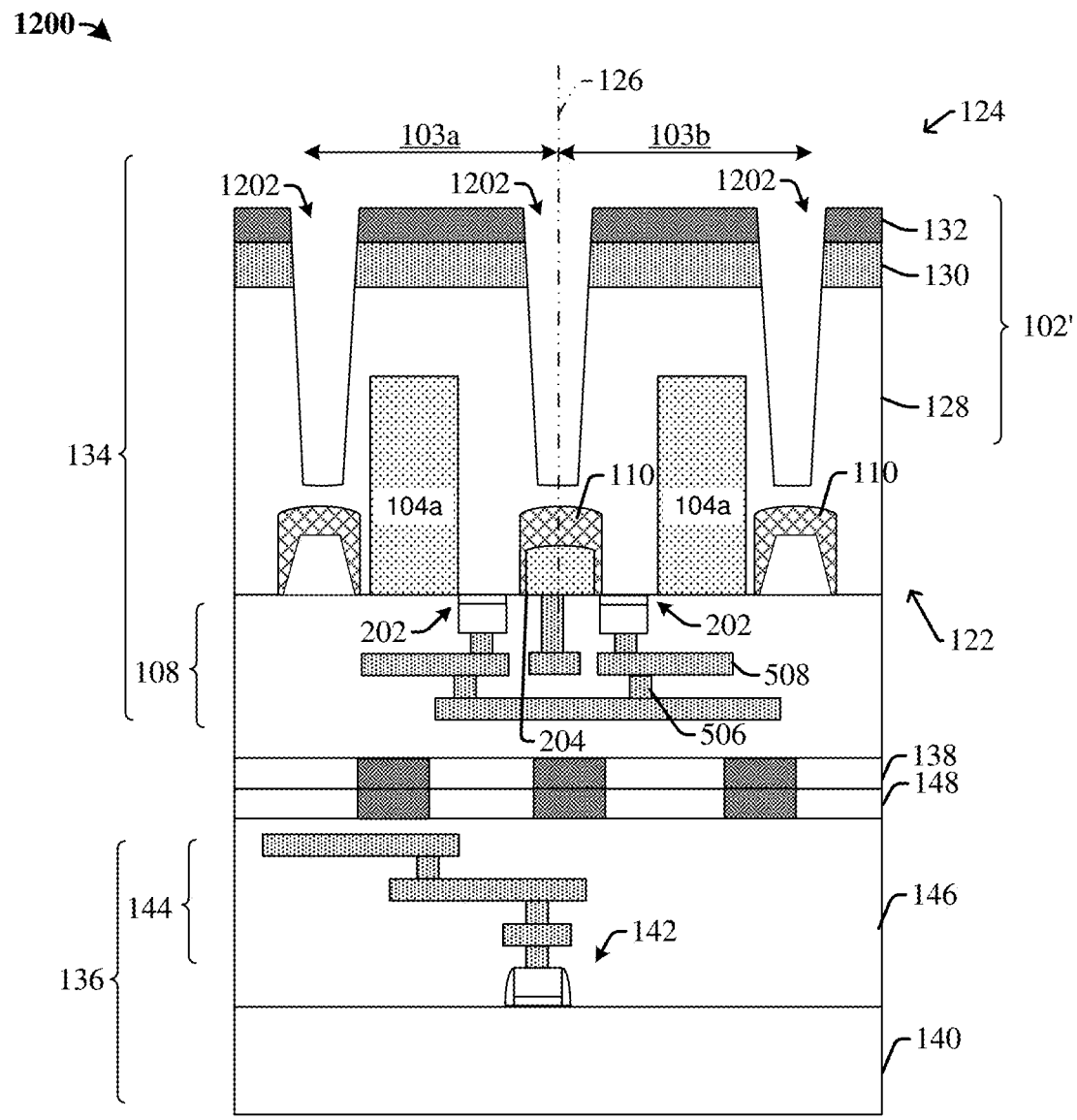

As shown in cross-sectional view 1200 of FIG. 12, the substrate 102' is selectively etched to form deep trenches 1202 within the back-side 124 of the image sensing die 134 laterally separates the photodiode 104. In some embodiments, the substrate 102' may be etched by forming a masking layer onto the back-side 124 of the image sensing die 134. The substrate 102' is then exposed to an etchant in regions not covered by the masking layer. The etchant etches the substrate 102' to form deep trenches 1202 extending to the substrate 102'. In various embodiments, the masking layer may comprise photoresist or a nitride (e.g., SiN) patterned using a photolithography process. The masking layer may also comprise ALD or plasma enhanced CVD oxide layer with a thickness range between about 200 angstrom (A) to about 1000 angstrom (A). In various embodiments, the etchant may comprise a dry etchant have an etching chemistry comprising a fluorine species (e.g., $CF_4$, $CHF_3$, $C_4F_8$, etc.) or a wet etchant (e.g., hydroflouric acid (HF) or tetramethylammonium hydroxide (TMAH)). The deep trenches 1202 may have a depth range between approximately 1.5 µm and approximately 5 µm. The critical dimension may have a range between approximately 0.1 µm and approximately 0.3 µm. In some embodiments, the deep trenches 1202 are formed to extend vertically into the doped isolation wells 110 and to create recessed bottom surfaces for the doped isolation wells 110.

Figure 13:
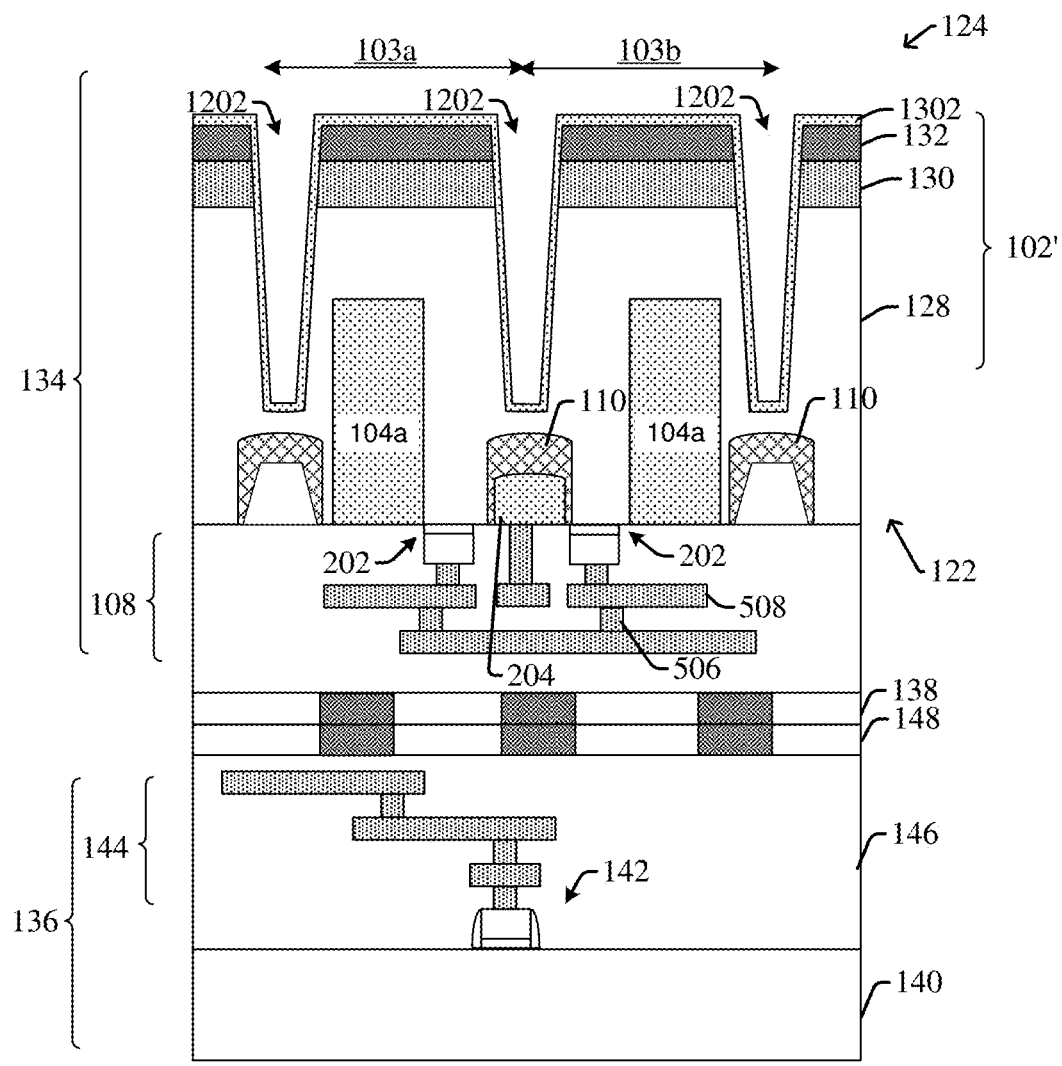
Figure 14:
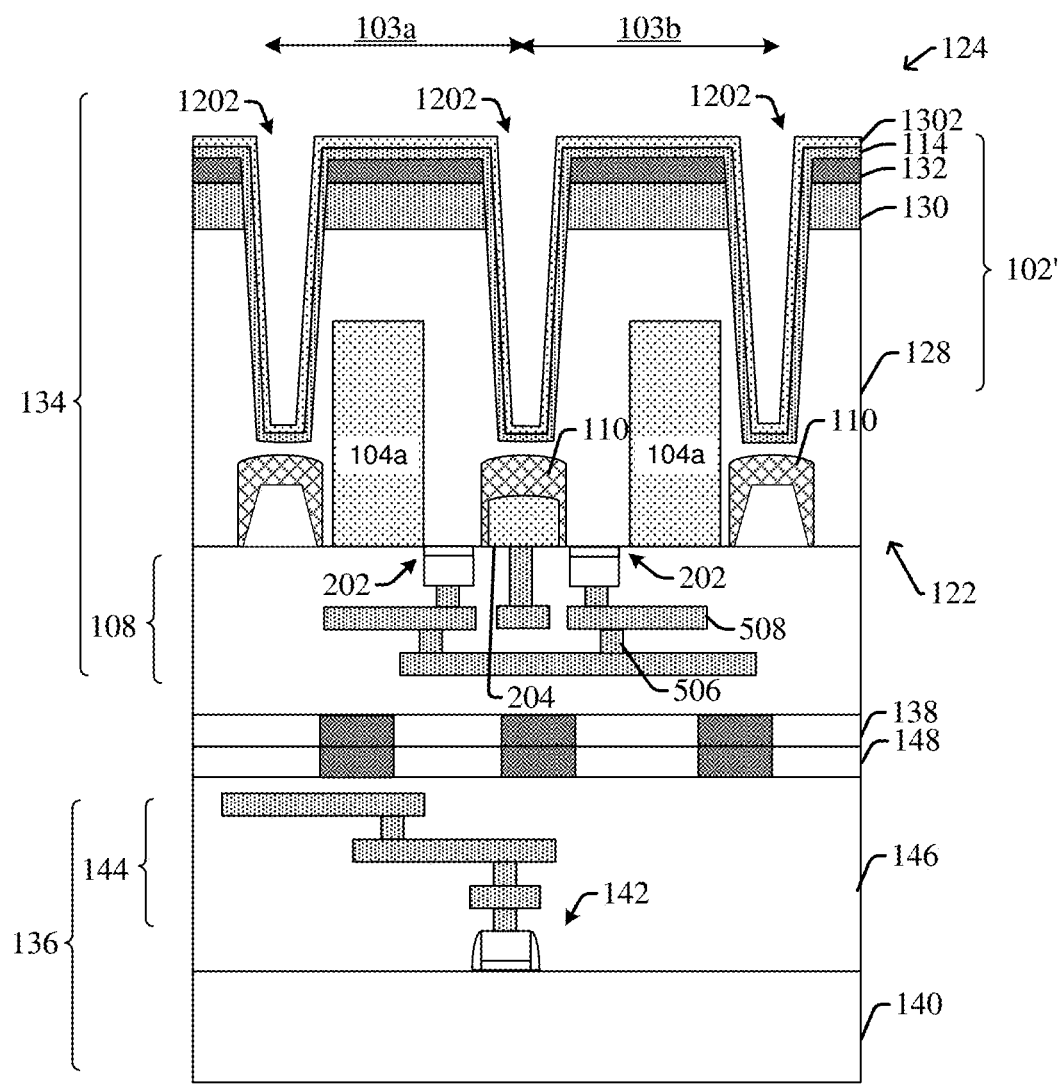
Figure 15:
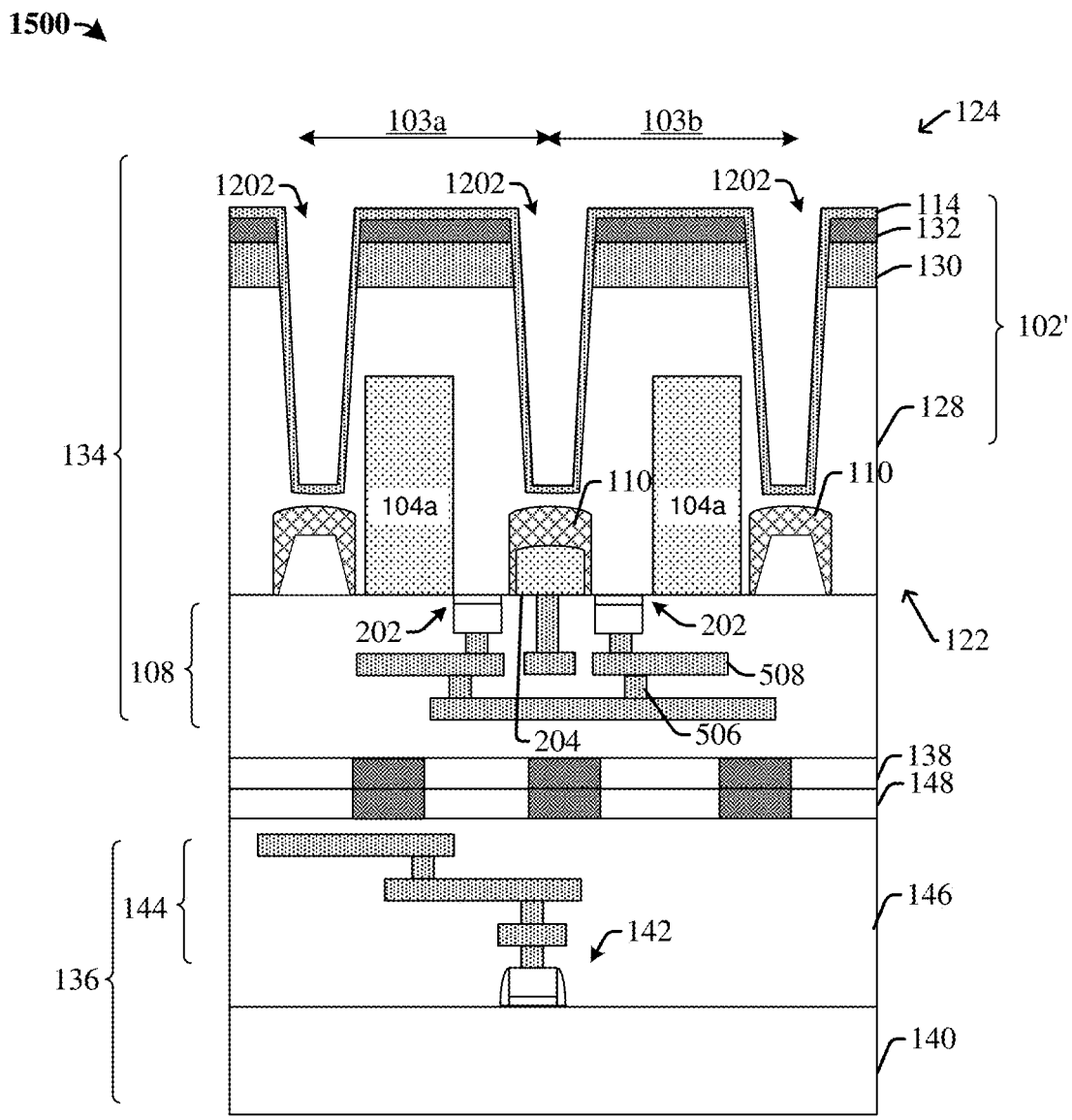

FIGS. 13-15 show some embodiments of a method of forming a doped liner 114 (see FIG. 14 or 15) using an enhanced plasma doping process with a protective layer.

As shown in cross-sectional view 1300 of FIG. 13, a protection layer 1302 is formed along sidewalls of the deep trenches 1202. In some embodiments, the protection layer 1302 comprises or is made of a dielectric material such as silicon dioxide, silicon nitride, or the combination thereof. The protection layer 1302 may also comprise or be made of a photoresist material. The protection layer 1302 may be made of a deposition process such as a chemical vapor deposition process (CVD) or an atomic layer deposition (ALD) process. As an example for non-limiting purposes, the protection layer 1302 may be made by an ALD process at a temperature range between about 250° C. to about 350° C. to form a dielectric layer with a thickness in a range of about 1 nm to about 10 nm.

As shown in cross-sectional view 1400 of FIG. 14, a doped liner 114 is formed under the protection layer 1302. The doped liner 114 may be formed by a plasma doping process. As an example for non-limiting purposes, processing gases may comprise boron trifluorid (BF3), diborane (B2H6), helium (He), argon (Ar), or other applicable gases. The dopant gases (e.g. BF3, B2H6, etc.) may have a dose concentration in a range between approximately 1E14 atom/$cm^2$ and approximately 2E17 atom/$cm^2$ with an energy in a range between approximately 1 keV and approximately 12 keV and a flow rate in a range between approximately 50 sccm and approximately 150 sccm. The plasma doping process can be performed at a pressure in a range between approximately 6 mtorr and approximately 18 mtorr with a plasma power in a range between approximately 600 W and approximately 800 W. A dopant concentration of the doped liner 114 may be in a range between approximately 5E17 atom/$cm^3$ to approximately 1E19 atom/$cm^3$. By using the plasma doping process with the protection layer 1302 in place to form the doped liner 114, the dopant concentration of the doped liner 114 may be formed greater and a thickness or junction depth may be formed smaller compared to other formation methods such as an implantation process. Thickness of the doped liner 114 may be better controlled by controlling a thickness of the protection layer 1302.

As shown in cross-sectional view 1500 of FIG. 15, the protection layer 1302 is removed after the formation of the doped liner 114. As an example for non-limiting purposes, the removal process may be performed by a wet etching using hydrofluoric acid (HF) for dielectric materials or a plasma etching process using oxygen followed by a wet strip for photoresist material.

The enhanced plasma doping process described above associated with FIGS. 13-15 provides an improved conformal doping layer with a more uniform thickness and uniform doping concentration, a smoother surface, and a less surface concentration by using the protection layer 1302. In some embodiments, the conformity is greater than 90% from top to bottom of the doped liner 114, which is improved from the conformity of a doped layer formed without a protection layer. In some embodiments, the surface roughness can be reduced to compared to the surface roughness of a doped layer formed without a protection layer. A surface concentration can be reduced from 1E22 to $1E19/cm^2$, or less than $1E20/cm^2$. Also, the doping profile can be better controlled by adjusting a thickness of the protection layer 1302. A thicker protection layer 1302 can help to form the doped liner 114 with a thinner thickness, less than 20 nm, or less than 5 nm, for example. As a result, dark current of the image sensor device formed by the enhanced plasma doping process can be reduced by approximately 74% compared to other method without using the protection layer.

Alternate to the enhanced plasma doping process described above, the doped liner 114 may also be formed by a low temperature epitaxial growth process, for example, an epitaxial growth process with a temperature lower than 500° C. As an example for non-limiting purposes, processing gases may comprise silane (SiH4), dichlorosilane (DCS, or $H_2SiCl_2$), B2H6, hydrogen (H2) or other applicable gases. The epitaxial growth process may be performed at a pressure in a range between approximately 4 torr and approximately 200 torr at a temperature range between approximately 400° C. to approximately 480° C. to form an epitaxial doped layer as the doped liner 114 with a thickness in a range between approximately 4 nm and approximately 20 nm. A dopant concentration of the doped liner 114 may be in a range between approximately 5E16 $atom/cm^3$ to approximately 5E18 $atom/cm^3$. In some alternative embodiments, the doped liner 114 may be formed by an atomic layer deposition process or other suitable techniques without forming and removing the protection layer 1302. Both the enhanced plasma doping process and the low temperature epitaxial process would result a better conformity than conventional beamline implant technique, which suffers shadowing effect for three-dimensional structure and cannot achieve desired conformity.

A dopant activation process is then performed after the formation of the doped liner 114 either using the enhanced plasma doping process described associated with FIGS. 13-15 or the low temperature epitaxial growth process described above. In some embodiments, the dopant activation process comprises or is a microwave annealing process. As an example for non-limiting purposes, the annealing gases may comprise nitrogen or hydrogen with a flow rate in a range between approximately 1 slm and approximately 20 slm. The annealing power may be in a range between approximately 3000 W and approximately 8000 W. The annealing time may be in a range between approximately 1 minute and approximately 20 minutes. In some alternative embodiments, the dopant activation process comprises or is a laser annealing process. As an example for non-limiting purposes, the annealing may use a green laser having an energy density a range between approximately 0.3 J and approximately 3 J for a time in a range between approximately 10 nanoseconds and approximately 100 nanoseconds. A wafer stage temperature may reach a range between approximately 250° C. and approximately 500° C. The dopant activation process is beneficial to low thermal budget products, especially compared to other approaches such as a deposition process followed by a thermal drive-in process, which either can't provide enough junction depth or not acceptable for low thermal budget product because of the high temperature junction drive-in and anneal for damage recovery and dopant activation.

Figure 16:
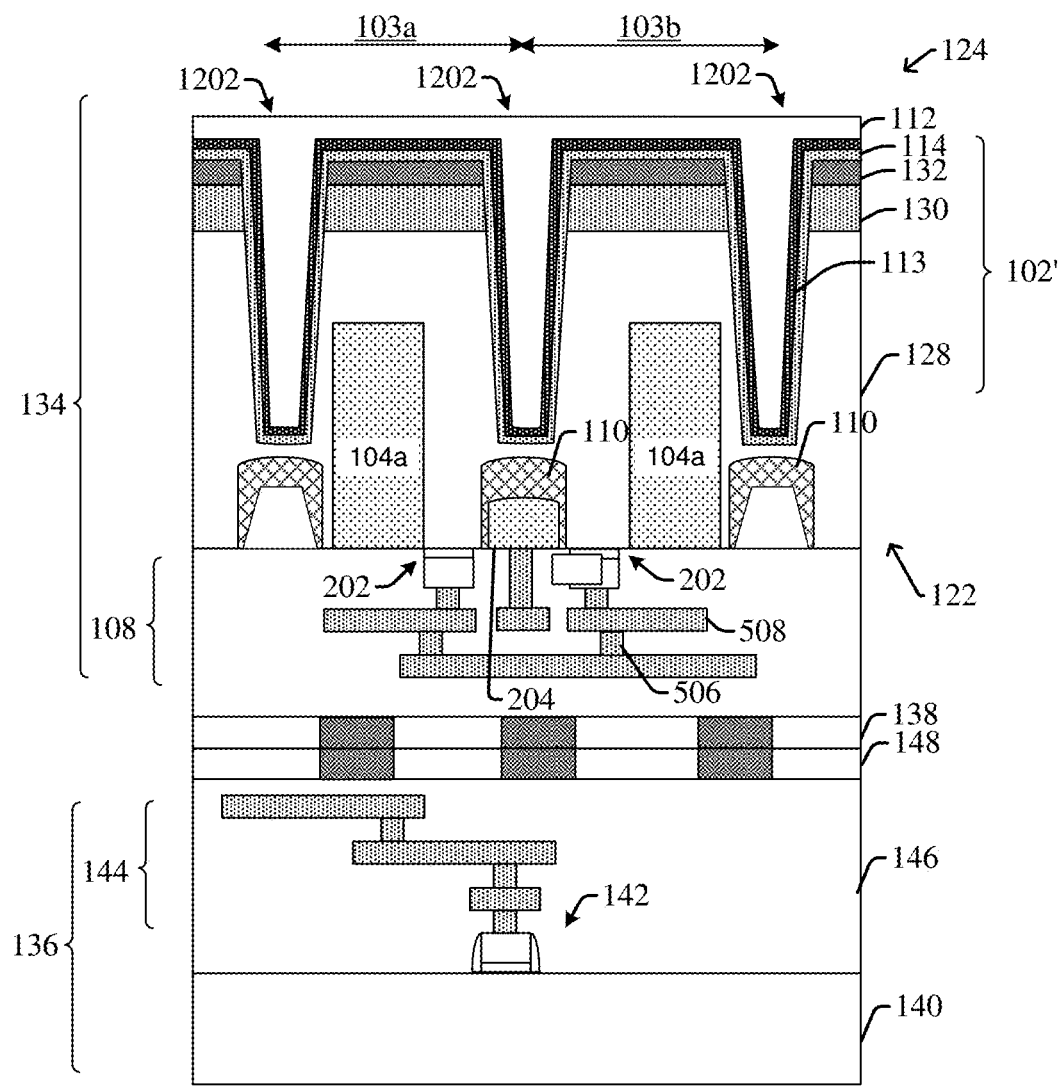

As shown in cross-sectional view 1600 of FIG. 16, the deep trenches 1202 are then filled with dielectric materials. In some embodiments, a high-k dielectric liner 113 is formed within the deep trenches 1202 onto the doped liner 114. The high-k dielectric liner 113 may be formed by deposition techniques and may comprise aluminum oxide (AlO), hafnium oxide (HfO), tantalum oxide (TaO) or other dielectric materials having a dielectric constant greater than that of silicon oxide. The doped liner 114 and the high-k dielectric liner 113 line sidewalls and bottom surfaces of the deep trenches 1202. In some embodiments, the doped liner 114 and the high-k dielectric liner 113 may extend over the back-side 124 of the image sensing die 134 between the deep trenches 1202. A dielectric fill layer 112 is formed to fill a remainder of the deep trenches 1202. In some embodiments, a planarization process is performed after forming the dielectric fill layer 112 to form a planar surface that extends along an upper surface of the high-k dielectric liner 113 and the dielectric fill layer 112. In some embodiments, the high-k dielectric liner 113 and the dielectric fill layer 112 may be deposited using a physical vapor deposition technique or a chemical vapor deposition technique. As a result, the BDTI structure 111 is formed in the substrate 102', extending from the back-side 124 to a position within the photodiode doping layer 128. The BDTI structure 111 is formed between and isolate adjacent pixel regions 103a, 103b.

Figure 17:
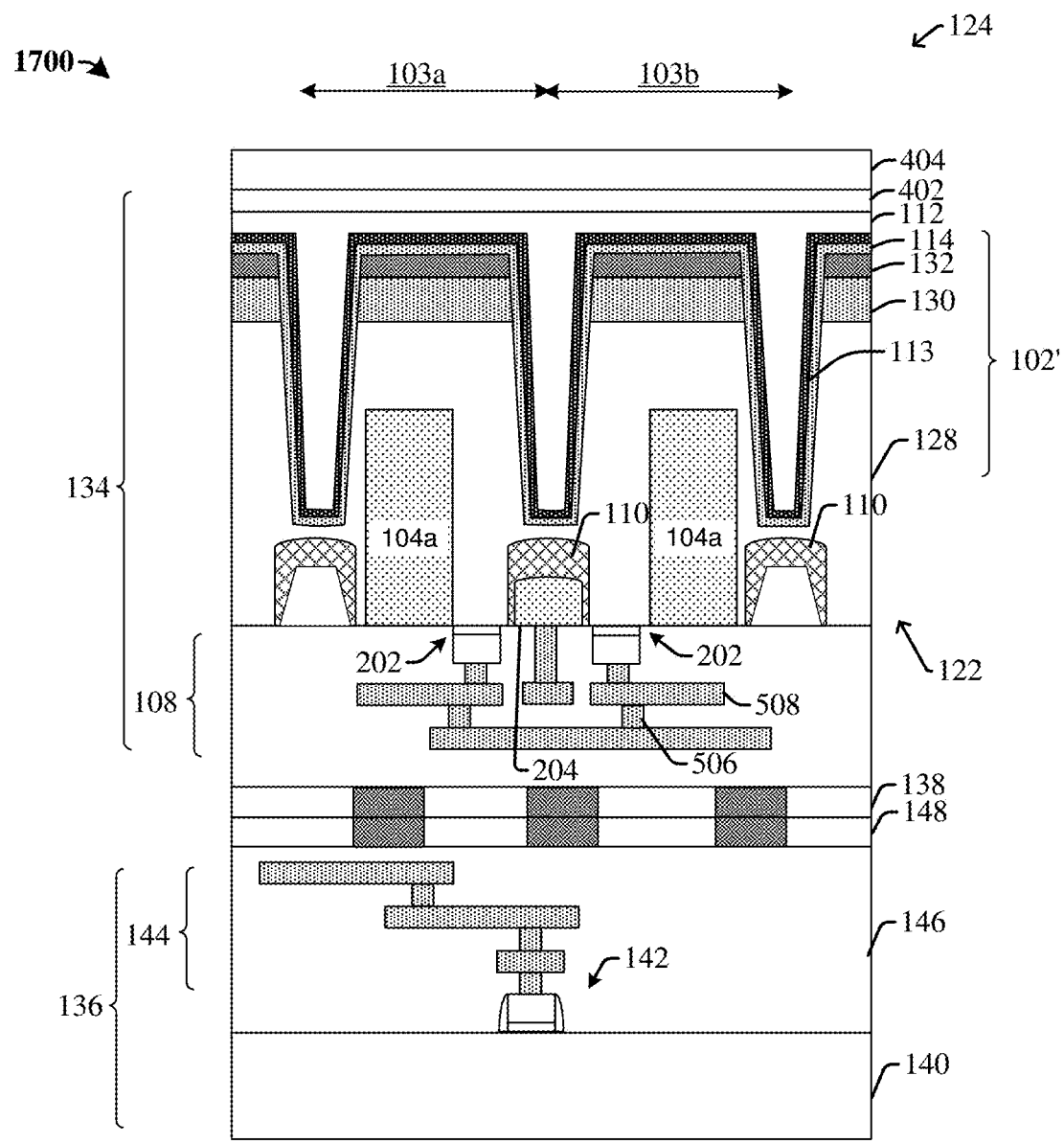
Figure 18:
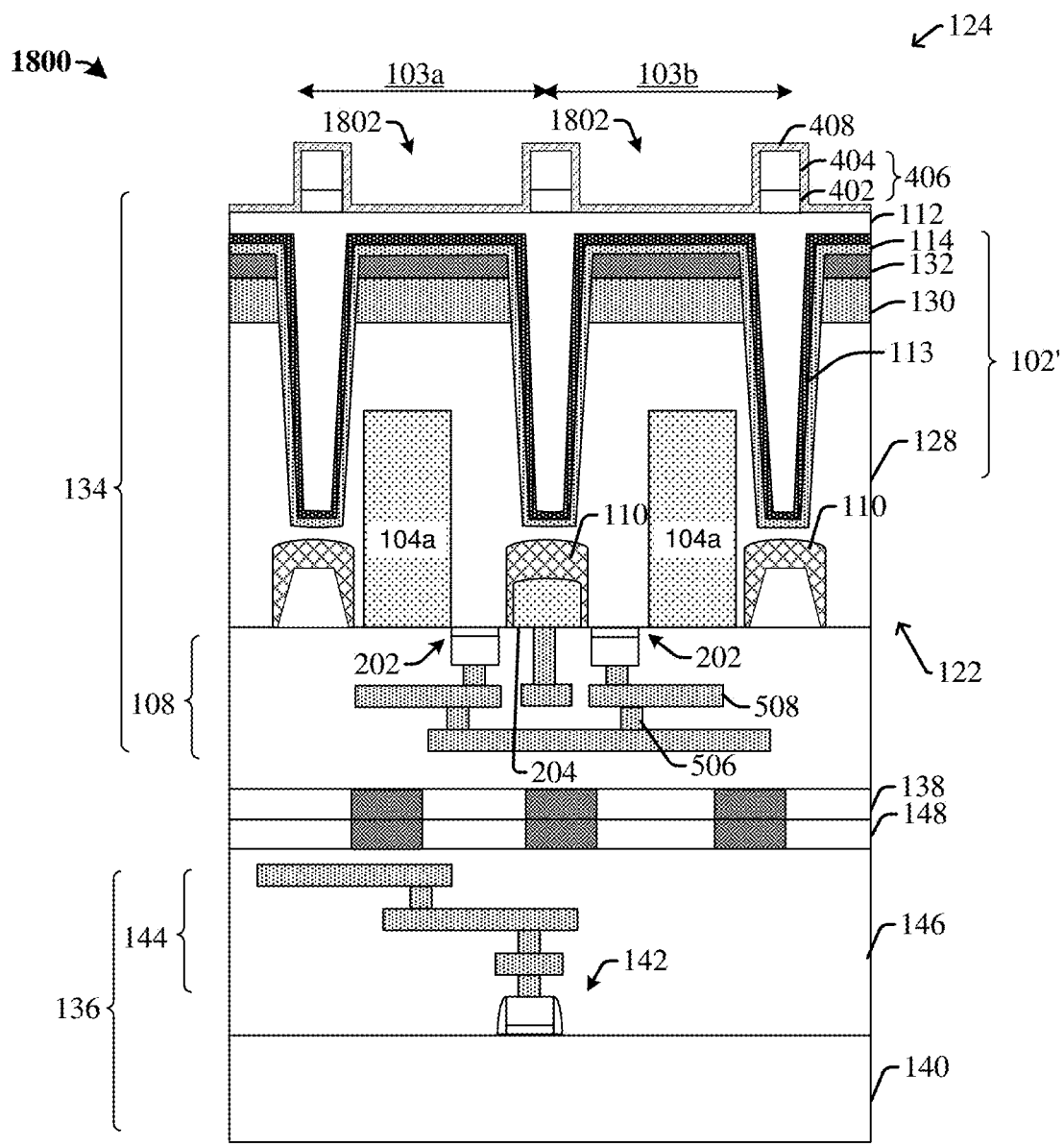
Figure 19:
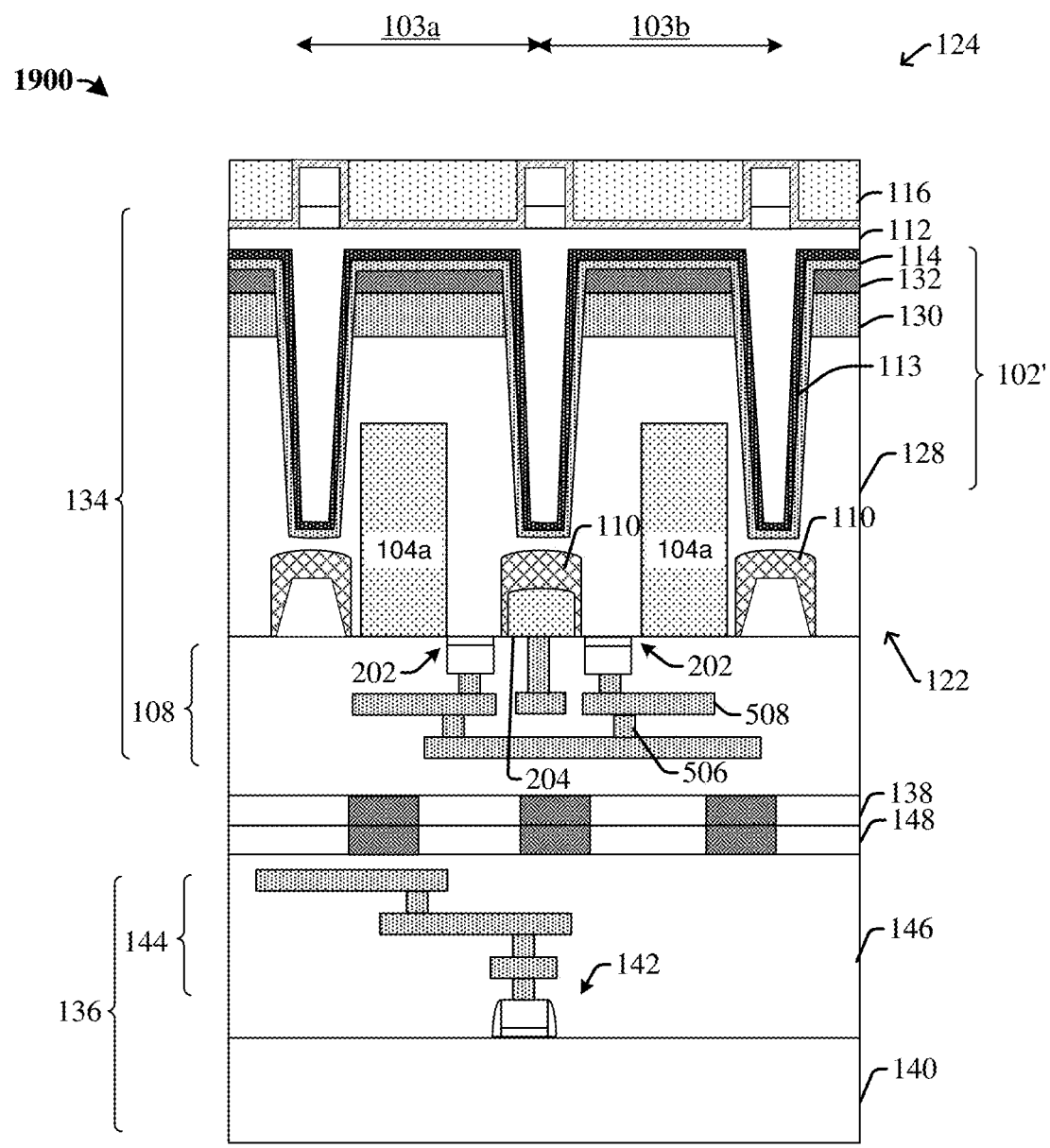

FIGS. 17-19 show some embodiments of a method of forming a composite grid 406 is formed arranged around openings 1802 overlying the photodiode doping column 104a (see FIG. 18). As shown in cross-sectional view 1700 of FIG. 17, a metal layer 402 and a dielectric layer 404 are stacked over the substrate 102' along the back side 124 of the image sensing die 134. The metal layer 402 may be or be comprised of one or more layers of tungsten, copper, aluminum copper, or titanium nitride. Other applicable metal materials are also within the scope of the disclosure. The dielectric layer 404 may be or be comprised of one or more layers of silicon dioxide, silicon nitride, or the combination thereof. The dielectric layer 404 may function as a hard mask layer. As shown in cross-sectional view 1800 of FIG. 18, an etch is performed to the metal layer 402 and the dielectric layer 404 to form the composite grid 406. The openings 1802 may be centrally aligned with the photodiode doping columns 104a so that the composite grid 406 is arranged around and between the photodiode doping columns 104a. Alternatively, the openings 1802 may be laterally shifted or offset in at least one direction from the photodiode doping columns 104a so that the composite grid 406 at least partially overlies the photodiode doping columns 104a. As shown in cross-sectional view 1900 of FIG. 19, a dielectric liner 408 is formed lining sidewall and top of the composite grid 406, and lining the openings 1802. Typically, the dielectric liner 408 is formed using a conformal deposition technique, such as, for example, chemical vapor deposition (CVD) or physical vapor deposition (PVD). The dielectric liner 408 may be, for example, formed of an oxide, such as silicon dioxide.

As illustrated by FIG. 19, color filters 116 corresponding to pixel sensors are formed in the openings 1802 of the corresponding pixel sensors. The color filter layer is formed of a material that allows light of the corresponding color to pass therethrough, while blocking light of other colors. Further, the color filters 116 may be formed with assigned colors. For example, the color filters 116 are alternatingly formed with assigned colors of red, green, and blue. The color filters 116 may be formed with upper surfaces aligned with that of the composite grid 406. The color filters 116 may be laterally shifted or offset in at least one direction from the photodiode doping columns 104*a* of the corresponding pixel sensors. Depending upon the extent of the shift or offset, the color filters 116 may partially fill the openings of the corresponding pixel sensors and may partially fill the openings of pixel sensors neighboring the corresponding pixel sensors. Alternatively, the color filters 116 may be symmetrical about vertical axes aligned with photodiode centers of the corresponding pixel sensors.

The process for forming the color filters 116 may include, for each of the different colors of the color assignments, forming a color filter layer and patterning the color filter layer. The color filter layer may be planarized subsequent to formation. The patterning may be performed by forming a photoresist layer with a pattern over the color filter layer, applying an etchant to the color filter layer according to the pattern of the photoresist layer, and removing the pattern photoresist layer.

Figure 20:
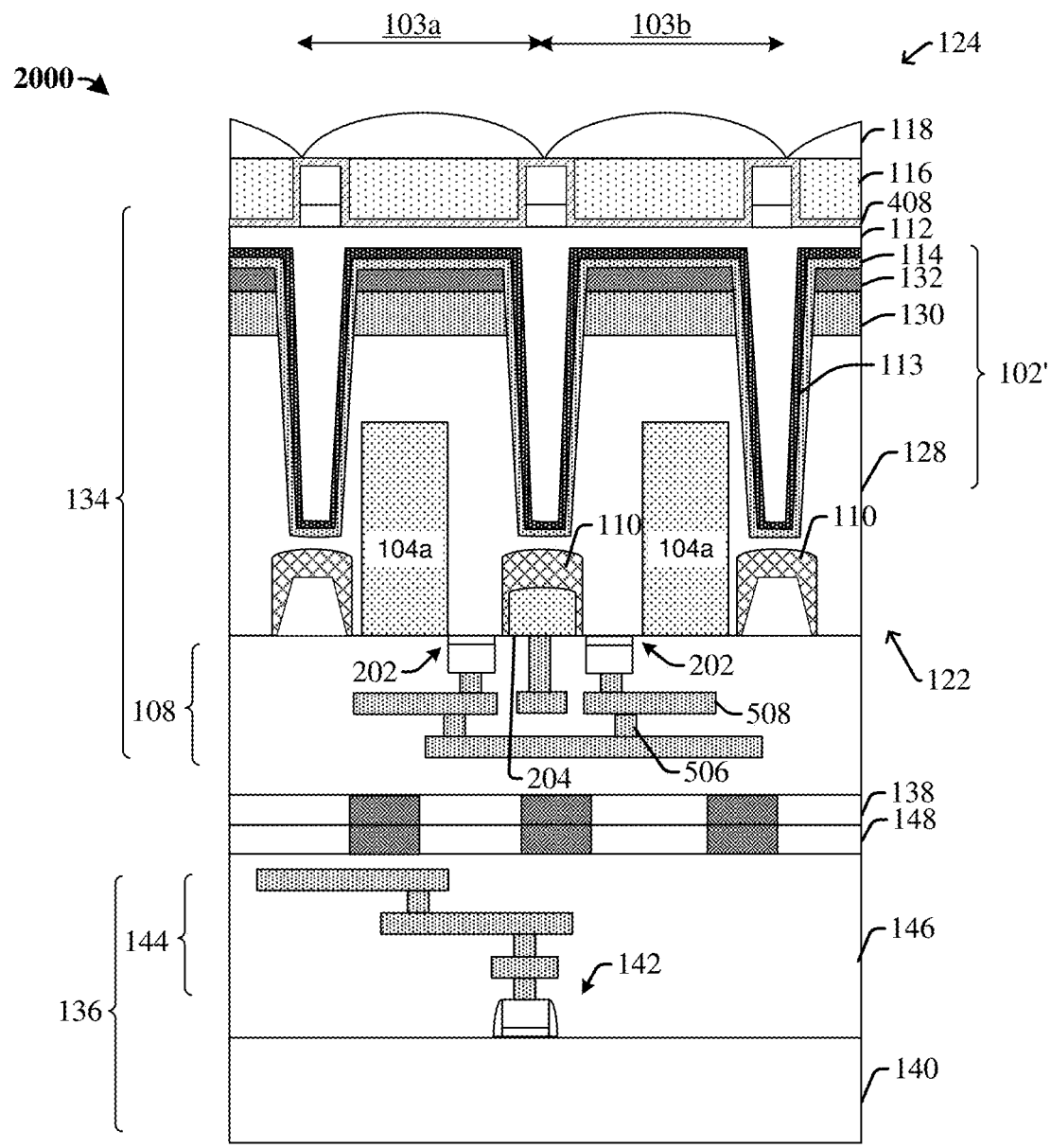

As illustrated by FIG. 20, micro-lenses 118 corresponding to the pixel sensors are formed over the color filters 116 of the corresponding pixel sensors. In some embodiments, the plurality of micro-lenses may be formed by depositing a micro-lens material above the plurality of color filters (e.g., by a spin-on method or a deposition process). A micro-lens template having a curved upper surface is patterned above the micro-lens material. In some embodiments, the micro-lens template may comprise a photoresist material exposed using a distributing exposing light dose (e.g., for a negative photoresist more light is exposed at a bottom of the curvature and less light is exposed at a top of the curvature), developed and baked to form a rounding shape. The micro-lenses 118 are then formed by selectively etching the micro-lens material according to the micro-lens template.

Figure 21:
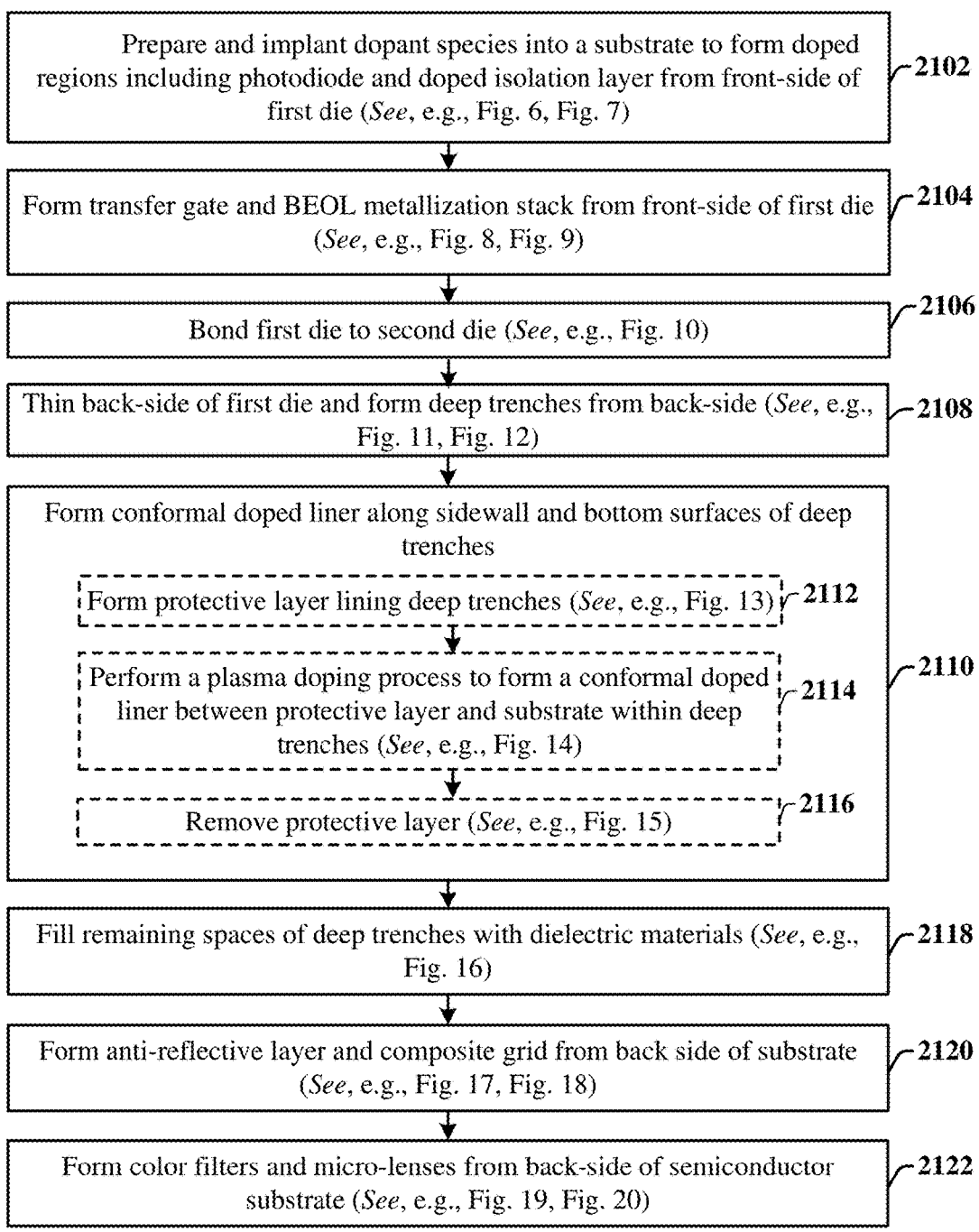
FIG. 21 illustrates a flow diagram of some embodiments of a method of forming an image sensor having a photodiode surrounded by a BDTI structure having a conformal doped layer.

FIG. 21 illustrates a flow diagram of some embodiments of a method 2100 of forming an image sensor having a photodiode surrounded by a BDTI structure having a conformal doped layer.

While disclosed method 2100 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 2102, a substrate is prepared for an image sensor. A photodiode and a doped isolation well are formed from the front-side of the image sensor. In some embodiments, an epitaxial layer is formed over a handling wafer as a photodiode doping layer, and photodiode doping columns and/or doped isolation wells may be formed by implanting dopant species into the front-side of the image sensing die. The doped isolation wells may be formed by a selective implantation to form a plurality of columns extending into the photodiode doping layer. In some embodiments, a shallow trench isolation region may be formed within the front-side of the image sensing die by selectively etching the substrate to form shallow-trenches and subsequently forming a dielectric (e.g. an oxide) within the shallow-trenches. FIGS. 6-7 illustrate cross-sectional views corresponding to some embodiments corresponding to act 2102.

At act 2104, a transfer gate is formed from the front-side of the substrate. A metallization stack is formed over the transfer gate on the front-side of the substrate. FIGS. 8-9 illustrate cross-sectional views corresponding to some embodiments corresponding to act 2104.

At act 2106, in some embodiments, the image sensor is bonded to one or more other dies such as a logic die or other image sensing dies. FIG. 10 illustrates a cross-sectional view corresponding to some embodiments corresponding to act 2106.

At act 2108, the substrate is thinned for further processing. A handling substrate may be partially or completely removed from a back-side of the substrate. Then, the substrate is selectively etched to form deep trenches between adjacent sensing pixel regions and extending into the substrate. The deep trenches may have a center line aligned with that of the doped isolation well and/or the shallow trench isolation region. FIGS. 11-12 illustrate cross-sectional views corresponding to some embodiments corresponding to act 2108.

At act 2110, a doped liner is formed along sidewall and bottom of the deep trenches. In some embodiments, the doped liner can be formed by an epitaxial process. The epitaxial process may be performed under a relative low temperature. In some alternative embodiments, the doped liner can be formed by an enhanced plasma doping process with a protection layer in place. Act 2112-act 2116 show an example of the enhanced plasma doping process. At act 2112, the protection layer is formed on sidewall and bottom surfaces of the deep trenches. FIG. 13 illustrates a cross-sectional view corresponding to some embodiments corresponding to act 2112. At act 2114, a plasma doping process is performed to form a doped liner between protection layer and substrate within deep trenches. FIG. 14 illustrates a cross-sectional view corresponding to some embodiments corresponding to act 2114. At act 2116, the protection layer is removed from the deep trenches after the plasma doping process. FIG. 15 illustrates a cross-sectional view corresponding to some embodiments corresponding to act 2116.

At act 2118, remaining spaces of the deep trenches are filled with dielectric materials. A high-k dielectric liner may be formed within the deep trenches onto the doped liner. FIG. 16 illustrates a cross-sectional view corresponding to some embodiments corresponding to act 2118.

At act 2120, anti-reflective layer and composite grid from back side of substrate. FIGS. 17-18 illustrate cross-sectional views corresponding to some embodiments corresponding to act 2120.

At act 2122, color filters and micro-lenses are formed over the back-side of the semiconductor substrate. FIGS. 19-20 illustrate cross-sectional views corresponding to some embodiments corresponding to act 2122.

Therefore, the present disclosure relates to an image sensor having a photodiode surrounded by a BDTI structure, and an associated method of formation. The BDTI structure comprises a doped liner lining a sidewall surface of a deep trench and a dielectric layer filling a remaining space of the deep trench. By forming the disclosed BDTI structure that functions as a doped well and an isolation structure, the implantation processes from a front-side of the substrate is simplified, and thus the exposure resolution and the full well capacity of the photodiode, and the blooming and crosstalk are reduced.

In some embodiments, the present disclosure relates to an image sensor. The image sensor comprises an image sensing die having a front-side and a back-side opposite to the front-side. A plurality of pixel regions is disposed within the image sensing die and respectively comprises a photodiode configured to convert radiation that enters from the back-side of the image sensor die into an electrical signal. The photodiode comprises a photodiode doping column with a first doping type surrounded by a photodiode doping layer with a second doping type that is different than the first doping type. A BDTI structure is disposed between adjacent pixel regions and extending from the back-side of the image sensor die to a position within the photodiode doping layer. The BDTI structure comprises a doped liner with the second doping type and a dielectric fill layer, the doped liner lining a sidewall surface of the dielectric fill layer.

In some alternative embodiments, the present disclosure relates to method of forming an image sensor. The method comprises forming photodiodes for a plurality of pixel regions from a front-side of an image sensing die. A photodiode comprises a photodiode doping column with a first doping type surrounded by a photodiode doping layer with a second doping type that is different than the first doping type. A doped isolation well is formed from the front-side of the image sensing die by implanting dopants into the photodiode doping layer through a plurality of implanting processes. A gate structure and a metallization stack are formed on the front-side of the image sensing die. The metallization stack comprises a plurality of metal interconnect layers arranged within one or more inter-level dielectric layers. The image sensing die is bonded to a logic die from the front-side of the image sensing die. The logic die comprises logic devices. A deep trench is formed between adjacent pixel regions by etching from a back-side of the image sensing. A doped liner with the second doping type is formed lining a sidewall surface of the deep trench. A dielectric fill layer fills an inner space of the deep trench to form a BDTI structure.

In yet other embodiments, the present disclosure relates to an integrated circuit. The integrated circuit comprises an image sensing die having a plurality of pixel regions respectively comprising a photodiode configured to convert radiation that enters the image sensing die from a back-side into an electrical signal. The photodiode comprises a photodiode doping column with a first doping type surrounded by a photodiode doping layer with a second doping type that is different than the first doping type. A BDTI structure is disposed between adjacent pixel regions and extending from the back-side of the image sensing die to a position within the photodiode doping layer. The BDTI structure comprises a doped liner with the second doping type and a dielectric fill layer. The doped liner lines a sidewall surface of the deep trench and the dielectric fill layer filling an inner space of the deep trench. A doped isolation well with the second doping type is disposed between the adjacent pixel regions and extending from a front-side of the image sensing die opposite to the back-side to a position within the photodiode doping layer. A metallization stack is arranged on the front-side and comprising a plurality of metal interconnect layers arranged within an inter-level dielectric layer. A logic die is bonded to the front-side of the image sensing die. The logic die comprises logic devices.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an image sensor, comprising:
   forming photodiodes for a plurality of pixel regions from a front-side of an image sensing die;
   forming a deep trench between adjacent pixel regions by etching from a back-side of the image sensing die;
   forming a protection layer lining the deep trench;
   performing a plasma doping process to form a conformal doped liner under the protective layer;
   performing an annealing process;
   removing the protection layer; and
   forming a dielectric fill layer filling an inner space of the deep trench to form a back-side deep trench isolation (BDTI) structure.

2. The method of claim 1, further comprising:
   after removing the protection layer, forming a high-k dielectric liner directly on and lining the conformal doped liner.

3. The method of claim 1, further comprising:
   forming a shallow trench isolation (STI) structure between the adjacent pixel regions from the front-side of the image sensing die to a position within the image sensing die,
   wherein the STI structure and the BDTI structure are vertically aligned.

4. The method of claim 1, wherein the conformal doped liner is formed to extend laterally along the back-side of the image sensing die.

5. The method of claim 1, wherein, by forming and removing the protection layer, the conformal doped liner is formed with a thickness smaller than 5 nm.

6. The method of claim 1, wherein, by forming and removing the protection layer, the conformal doped liner is formed with a surface concentration smaller than $1E19/cm^2$ and a doping concentration in a range between approximately $5E17$ atoms/$cm^3$ to approximately $1E19$ atoms/$cm^3$.

7. The method of claim 1, wherein, by forming and removing the protection layer, the conformal doped liner is formed with a conformity greater than 90% from top to bottom.

8. The method of claim 1, wherein the annealing process is performed with an annealing temperature in a range of from 250° C. to approximately 500° C.

9. The method of claim 1, wherein the photodiodes are formed by forming photodiode doping columns with a first doping type surrounded by a photodiode doping layer with a second doping type that is different than the first doping type.

10. The method of claim 9,
    forming a doped isolation well with the second doping type between the adjacent pixel regions and extending from the front-side of the image sensing die to a position within the photodiode doping layer,
    wherein the doped isolation well is formed vertically aligned with the BDTI structure.

11. The method of claim 10, wherein the doped isolation well is formed to be separated from the BDTI structure by the photodiode doping layer.

12. The method of claim 10, wherein the doped isolation well and the BDTI structure are formed to meet within the photodiode doping layer.

13. The method of claim 10, wherein a bottom portion of the BDTI structure is formed within a recessed top surface of the doped isolation well.

14. The method of claim 1, further comprising:
   forming a floating diffusion well between the adjacent pixel regions from the front-side of image sensing die to a position within the image sensing die; and
   forming a transfer gate on the front-side of the image sensing die at a position laterally between the photodiode and the floating diffusion well.

15. The method of claim 1, further comprising:
   forming a metallization stack on the front-side of the image sensing die with a plurality of metal interconnect layers within one or more inter-level dielectric layers.

16. The method of claim 1, further comprising:
   bonding a logic die to the image sensing die from the front-side of the image sensing die,
   wherein the logic die is formed with logic devices.

17. A method of forming an image sensor, comprising:
   forming photodiodes for a plurality of pixel regions from a front-side of an image sensing die, a photodiode comprising a photodiode doping column with a first doping type surrounded by a photodiode doping layer with a second doping type that is different than the first doping type;
   bonding the image sensing die to a logic die from the front-side of the image sensing die, wherein the logic die comprises logic devices;
   forming a deep trench between adjacent pixel regions by etching from a back-side of the image sensing die;
   forming a doped liner with the second doping type lining a sidewall surface of the deep trench; and
   forming a dielectric fill layer filling an inner space of the deep trench to form a back-side deep trench isolation (BDTI) structure,
   wherein the doped liner is formed by an epitaxial process under a temperature lower than 500° C. followed by an annealing process.

18. The method of claim 17, further comprising forming a doped isolation well from the front-side of the image sensing die by implanting dopants into the photodiode doping layer through a plurality of implanting processes, performing an annealing process.

19. The method of claim 17, further comprising forming a gate structure and a metallization stack on the front-side of the image sensing die, wherein the metallization stack comprises a plurality of metal interconnect layers arranged within one or more inter-level dielectric layers.

20. A method for forming an integrated circuit, comprising:
   forming photodiodes for a plurality of pixel regions of an image sensing die, wherein the photodiodes are formed with photodiode doping columns with a first doping type surrounded by a photodiode doping layer with a second doping type that is different than the first doping type;
   forming a back-side deep trench isolation (BDTI) structure between the plurality of pixel regions and extending from a back-side of the image sensing die to a position within the photodiode doping layer, wherein the BDTI structure is formed with a doped liner of the second doping type lining a deep trench, the doped liner formed underlying a protection layer followed by removing the protection layer prior to forming a dielectric fill layer to fill the deep trench; and
   forming a doped isolation well with the second doping type between the pixel regions and extending from a front-side of the image sensing die opposite to the back-side to a position within the photodiode doping layer.

* * * * *